(12) United States Patent
Chen et al.

(10) Patent No.: US 8,076,765 B2
(45) Date of Patent: Dec. 13, 2011

(54) STACKABLE SEMICONDUCTOR DEVICE PACKAGES INCLUDING OPENINGS PARTIALLY EXPOSING CONNECTING ELEMENTS, CONDUCTIVE BUMPS, OR CONDUCTIVE CONDUCTORS

(75) Inventors: Kuang-Hsiung Chen, Taoyuan County (TW); Chi-Chih Shen, Kaohsiung (TW); Jen-Chuan Chen, Taoyuan County (TW); Wen-Hsiung Chang, Hsinchu (TW); Hui-Shan Chang, Jhongli (TW); Pei-Yu Hsu, Hsin-Pu Township, Hsinchu County (TW); Fa-Hao Wu, Pingjhen (TW); Chen-Yu Chia, Gueishan Township, Taoyuan County (TW); Chi-Chih Chu, Kaohsiung (TW); Cheng-Yi Weng, Kaohsiung (TW); Ya-Wen Hsu, Tainan (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 96 days.

(21) Appl. No.: 12/507,305

(22) Filed: Jul. 22, 2009

(65) Prior Publication Data

US 2010/0171205 A1 Jul. 8, 2010

(30) Foreign Application Priority Data

Jan. 7, 2009 (TW) ............................. 98100325 A

(51) Int. Cl.
*H01L 21/44* (2006.01)
*H01L 21/302* (2006.01)
*H01L 21/461* (2006.01)

(52) U.S. Cl. .................. 257/686; 257/690; 257/738

(58) Field of Classification Search .................. 257/686, 257/690, 738, E21.499, E25.027
See application file for complete search history.

(56) References Cited

U.S. PATENT DOCUMENTS

| 5,128,831 A | 7/1992 | Fox, III et al. |
| 5,222,014 A | 6/1993 | Lin |

(Continued)

FOREIGN PATENT DOCUMENTS

JP 07335783 12/1995

(Continued)

OTHER PUBLICATIONS

Yoshida et al., A Study on Package Stacking Process for Package-on-Package (PoP) Electronic Components and Tech. Conf. (ECTC), May 2006, San Diego, CA.

(Continued)

*Primary Examiner* — William M. Brewster
(74) *Attorney, Agent, or Firm* — Cooley LLP

(57) ABSTRACT

In one embodiment, a semiconductor device package includes: (1) a substrate unit; (2) connecting elements disposed adjacent to a periphery of the substrate unit and extending upwardly from an upper surface of the substrate unit; (3) a semiconductor device disposed adjacent to the upper surface of the substrate unit and electrically connected to the substrate unit; and (4) a package body disposed adjacent to the upper surface of the substrate unit and covering the semiconductor device. A lateral surface of the package body is substantially aligned with a lateral surface of the substrate unit. The package body defines openings that at least partially expose respective ones of the connecting elements. At least one of the connecting elements has a width $W_C$, and at least one of the openings has a width $W_U$ adjacent to an upper surface of the package body, such that $W_U > W_C$.

25 Claims, 12 Drawing Sheets

U.S. PATENT DOCUMENTS

| | | | |
|---|---|---|---|
| 5,355,580 | A | 10/1994 | Tsukada |
| 5,579,207 | A | 11/1996 | Hayden et al. |
| 5,594,275 | A | 1/1997 | Kwon et al. |
| 5,608,265 | A | 3/1997 | Kitano et al. |
| 5,714,800 | A | 2/1998 | Thompson |
| 5,726,493 | A | 3/1998 | Yamashita et al. |
| 5,748,452 | A | 5/1998 | Londa |
| 5,763,939 | A | 6/1998 | Yamashita |
| 5,844,315 | A | 12/1998 | Melton et al. |
| 5,861,666 | A | 1/1999 | Bellaar |
| 5,883,426 | A | 3/1999 | Tokuno et al. |
| 5,892,290 | A | 4/1999 | Chakravorty et al. |
| 5,973,393 | A | 10/1999 | Chia et al. |
| 5,985,695 | A | 11/1999 | Freyman et al. |
| 6,177,724 | B1 | 1/2001 | Sawai |
| 6,194,250 | B1 | 2/2001 | Melton et al. |
| 6,195,268 | B1 | 2/2001 | Eide |
| 6,303,997 | B1 | 10/2001 | Lee |
| 6,451,624 | B1 | 9/2002 | Farnworth et al. |
| 6,489,676 | B2 | 12/2002 | Taniguchi et al. |
| 6,501,165 | B1 | 12/2002 | Farnworth et al. |
| 6,614,104 | B2 | 9/2003 | Farnworth et al. |
| 6,740,546 | B2 | 5/2004 | Corisis et al. |
| 6,740,964 | B2 | 5/2004 | Sasaki |
| 6,787,392 | B2 * | 9/2004 | Quah ............... 438/112 |
| 6,798,057 | B2 | 9/2004 | Bolkin et al. |
| 6,812,066 | B2 | 11/2004 | Taniguchi et al. |
| 6,815,254 | B2 | 11/2004 | Mistry et al. |
| 6,828,665 | B2 | 12/2004 | Pu et al. |
| 6,847,109 | B2 | 1/2005 | Shim |
| 6,861,288 | B2 | 3/2005 | Shim et al. |
| 6,888,255 | B2 | 5/2005 | Murtuza et al. |
| 6,924,550 | B2 | 8/2005 | Corisis et al. |
| 6,936,930 | B2 | 8/2005 | Wang |
| 6,974,334 | B2 | 12/2005 | Hung |
| 7,002,805 | B2 | 2/2006 | Lee |
| 7,015,571 | B2 | 3/2006 | Chang et al. |
| 7,026,709 | B2 | 4/2006 | Tsai et al. |
| 7,029,953 | B2 | 4/2006 | Sasaki |
| 7,034,386 | B2 | 4/2006 | Kurita |
| 7,049,692 | B2 | 5/2006 | Nishimura et al. |
| 7,061,079 | B2 | 6/2006 | Weng et al. |
| 7,185,426 | B1 | 3/2007 | Hiner et al. |
| 7,187,068 | B2 | 3/2007 | Suh et al. |
| 7,242,081 | B1 | 7/2007 | Lee |
| 7,262,080 | B2 | 8/2007 | Go et al. |
| 7,279,784 | B2 | 10/2007 | Liu |
| 7,279,789 | B2 | 10/2007 | Cheng |
| 7,288,835 | B2 | 10/2007 | Yim et al. |
| 7,309,913 | B2 | 12/2007 | Shim et al. |
| 7,345,361 | B2 | 3/2008 | Mallik et al. |
| 7,354,800 | B2 | 4/2008 | Carson |
| 7,364,945 | B2 | 4/2008 | Shim et al. |
| 7,365,427 | B2 | 4/2008 | Lu et al. |
| 7,372,141 | B2 | 5/2008 | Karnezos et al. |
| 7,408,244 | B2 | 8/2008 | Lee et al. |
| 7,417,329 | B2 | 8/2008 | Chuang et al. |
| 7,429,786 | B2 | 9/2008 | Karnezos et al. |
| 7,429,787 | B2 | 9/2008 | Karnezos et al. |
| 7,436,055 | B2 | 10/2008 | Hu |
| 7,436,074 | B2 | 10/2008 | Pan et al. |
| 7,473,629 | B2 | 1/2009 | Tai et al. |
| 7,550,832 | B2 | 6/2009 | Weng et al. |
| 7,550,836 | B2 | 6/2009 | Chou et al. |
| 7,560,818 | B2 | 7/2009 | Tsai |
| 7,586,184 | B2 | 9/2009 | Hung et al. |
| 7,589,408 | B2 | 9/2009 | Weng et al. |
| 7,642,133 | B2 | 1/2010 | Wu et al. |
| 7,719,094 | B2 | 5/2010 | Wu et al. |
| 7,723,839 | B2 | 5/2010 | Yano et al. |
| 7,777,351 | B1 | 8/2010 | Berry et al. |
| 7,838,334 | B2 | 11/2010 | Yu et al. |
| 2004/0126927 | A1 | 7/2004 | Lin et al. |
| 2004/0191955 | A1 * | 9/2004 | Joshi et al. ............... 438/106 |
| 2005/0117835 | A1 | 6/2005 | Nguyen et al. |
| 2005/0121764 | A1 | 6/2005 | Mallik |
| 2006/0170112 | A1 | 8/2006 | Tanaka et al. |
| 2006/0220210 | A1 | 10/2006 | Karnezos et al. |
| 2006/0240595 | A1 | 10/2006 | Lee |
| 2006/0244117 | A1 | 11/2006 | Karnezos et al. |
| 2007/0108583 | A1 | 5/2007 | Shim et al. |
| 2007/0241453 | A1 | 10/2007 | Ha et al. |
| 2007/0273049 | A1 | 11/2007 | Khan et al. |
| 2007/0290376 | A1 | 12/2007 | Zhao et al. |
| 2008/0017968 | A1 * | 1/2008 | Choi et al. ............... 257/686 |
| 2008/0073769 | A1 | 3/2008 | Wu et al. |
| 2010/0000775 | A1 | 1/2010 | Shen et al. |
| 2010/0032821 | A1 | 2/2010 | Pagaila et al. |
| 2010/0171206 | A1 | 7/2010 | Chu et al. |
| 2010/0171207 | A1 | 7/2010 | Shen et al. |
| 2011/0049704 | A1 | 3/2011 | Sun et al. |
| 2011/0117700 | A1 | 5/2011 | Weng et al. |

FOREIGN PATENT DOCUMENTS

| | | |
|---|---|---|
| JP | 2000-294720 | 10/2000 |
| JP | 2001298115 | 10/2001 |
| JP | 2002158312 | 5/2002 |
| JP | 2002170906 | 6/2002 |
| JP | 2004327855 | 11/2004 |
| JP | 2009054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 4/2006 |

OTHER PUBLICATIONS

Dreiza et al., "High Density PoP (Package-on-Package) and Package Stacking Development" Electronic Components and Technology Conf. (May 2007).

Chen et al., U.S. Appl. No. 12/544,560, filed Aug. 20, 2009 for Package-on-Package Device, Semiconductor Package, and Method for Manufacturing the Same. Office Action mailed Mar. 1, 2011.

Chu, et al., U.S. Appl. No. 12/818,422, filed Jun. 18, 2010 for "Semiconductor Package".

Shen et al., U.S. Appl. No. 12/547,063, filed Aug. 25, 2009 for "Stackable Semiconductor Device Packages". Office Action mailed Dec. 27, 2010; Notice Allowance mailed Apr. 27, 2011.

* cited by examiner

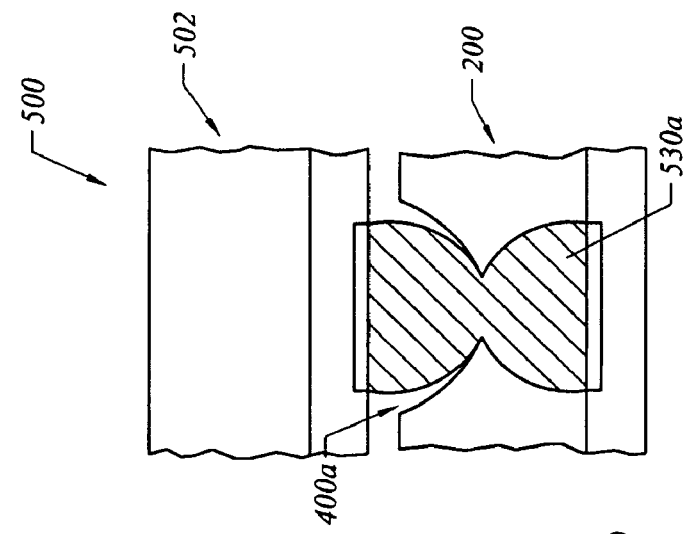
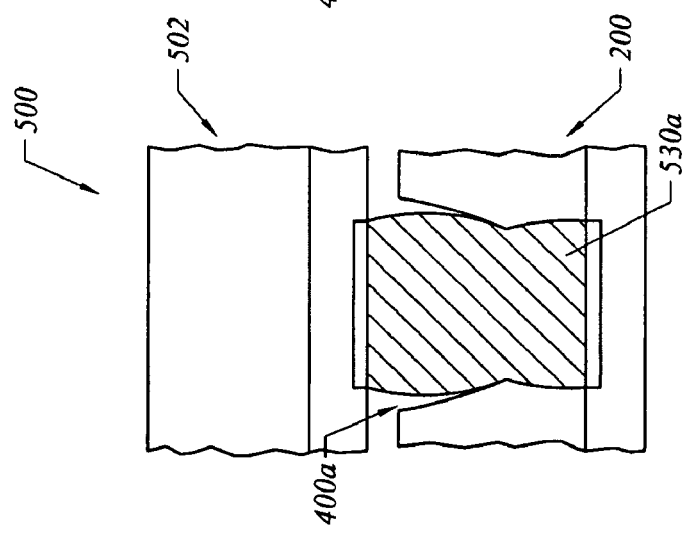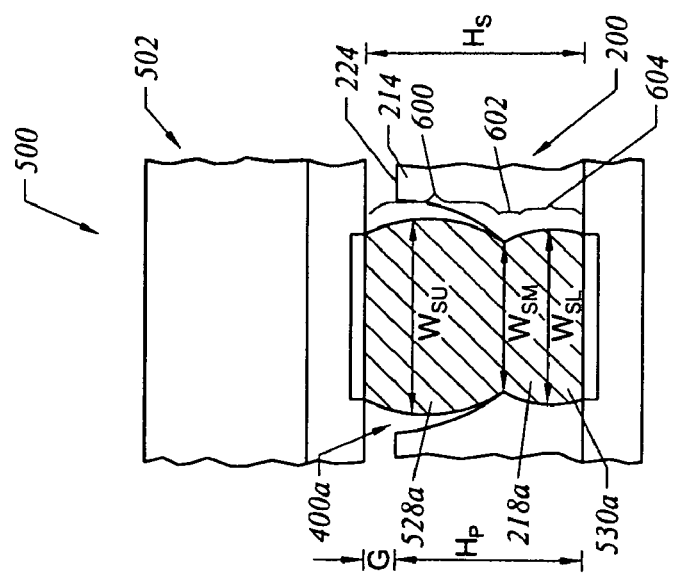

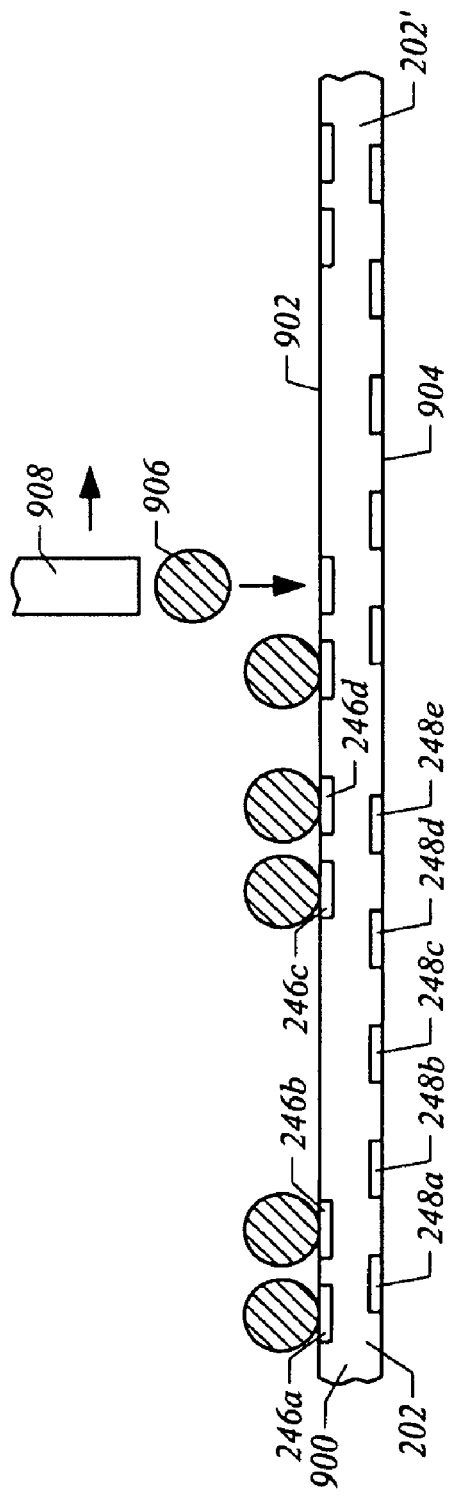
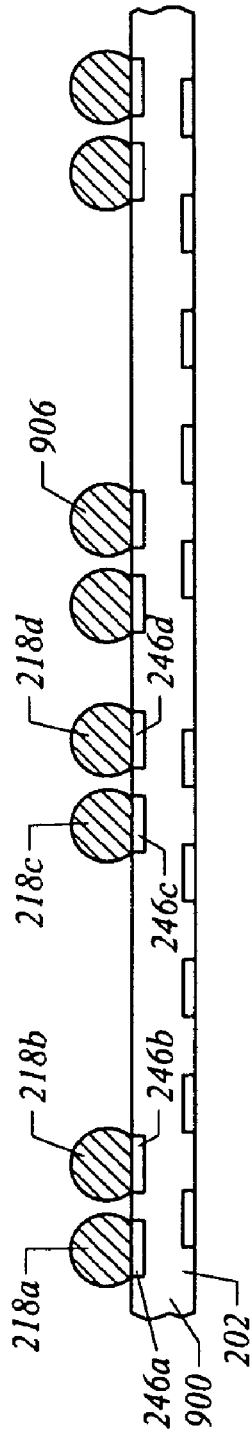
FIG. 9A
FIG. 9B

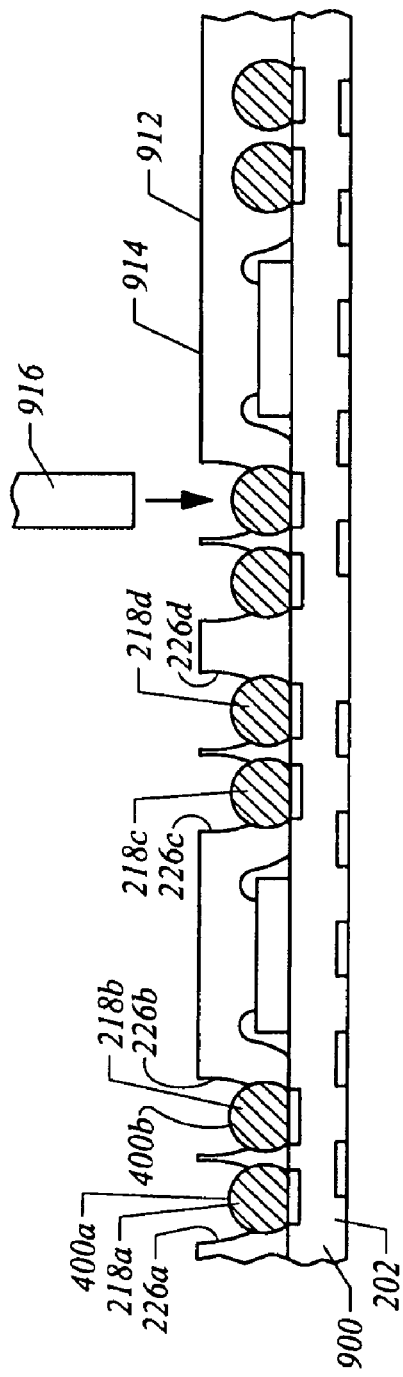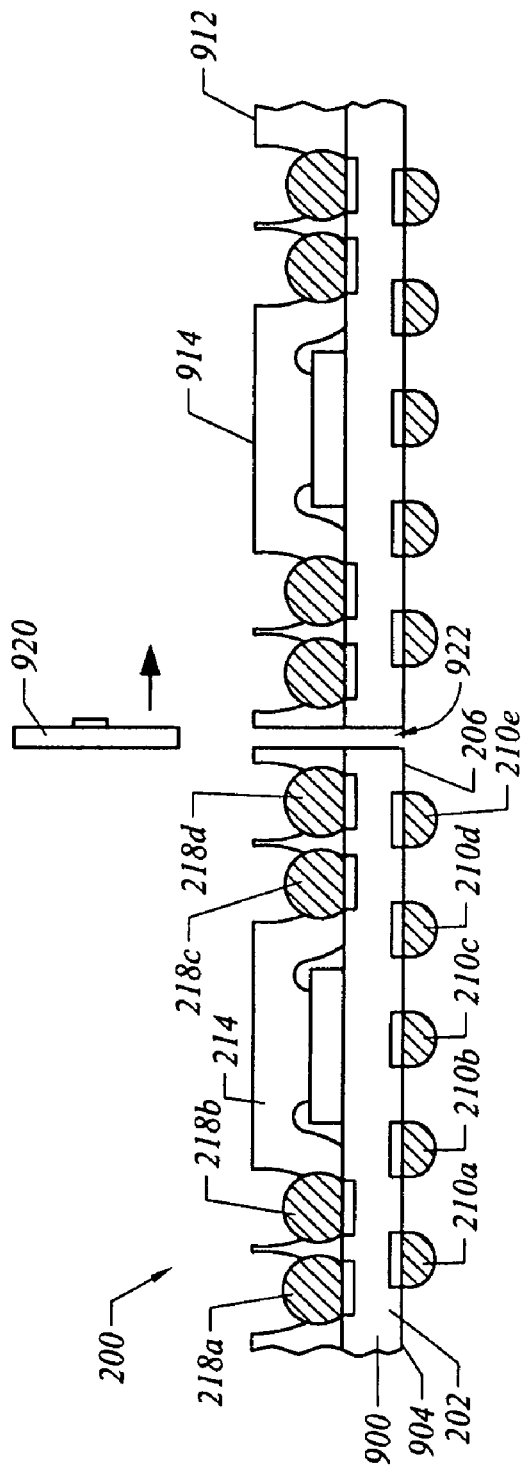

STACKABLE SEMICONDUCTOR DEVICE PACKAGES INCLUDING OPENINGS PARTIALLY EXPOSING CONNECTING ELEMENTS, CONDUCTIVE BUMPS, OR CONDUCTIVE CONDUCTORS

CROSS REFERENCE TO RELATED APPLICATION

This application claims the benefit of Taiwan Application Serial No. 98100325, filed on Jan. 7, 2009, the disclosure of which is incorporated herein by reference in its entirety.

FIELD OF THE INVENTION

The invention relates generally to semiconductor device packages. More particularly, the invention relates to stackable semiconductor device packages.

BACKGROUND

Electronic products have become progressively more complex, driven at least in part by the demand for enhanced functionality and smaller sizes. While the benefits of enhanced functionality and smaller sizes are apparent, achieving these benefits also can create problems. In particular, electronic products typically have to accommodate a high density of semiconductor devices in a limited space. For example, the space available for processors, memory devices, and other active or passive devices can be rather limited in cell phones, personal digital assistants, laptop computers, and other portable consumer products. In conjunction, semiconductor devices are typically packaged in a fashion to provide protection against environmental conditions as well as to provide input and output electrical connections. Packaging of semiconductor devices within semiconductor device packages can take up additional valuable space within electronic products. As such, there is a strong drive towards reducing footprint areas taken up by semiconductor device packages. One approach along this regard is to stack semiconductor device packages on top of one another to form a stacked package assembly, which is also sometimes referred as a package-on-package ("PoP") assembly.

FIG. 1 illustrates a stacked package assembly 100 implemented in accordance with a conventional approach, in which a top package 102 is disposed above and electrically connected to a bottom package 104. The top package 102 includes a substrate unit 106 and a semiconductor device 108, which is disposed on an upper surface 118 of the substrate unit 106. The top package 102 also includes a package body 110 that covers the semiconductor device 108. Similarly, the bottom package 104 includes a substrate unit 112, a semiconductor device 114, which is disposed on an upper surface 120 of the substrate unit 112, and a package body 116, which covers the semiconductor device 114. Referring to FIG. 1, a lateral extent of the package body 116 is less than that of the substrate unit 112, such that a peripheral portion of the upper surface 120 remains exposed. Extending between this peripheral portion and a lower surface 122 of the substrate unit 106 are solder balls, including solder balls 124a and 124b, which are initially part of the top package 102 and are reflowed during stacking operations to electrically connect the top package 102 to the bottom package 104. As illustrated in FIG. 1, the bottom package 104 also includes solder balls 126a, 126b, 126c, and 126d, which extend from a lower surface 128 of the substrate unit 112 and provide input and output electrical connections for the assembly 100.

While a higher density of the semiconductor devices 108 and 114 can be achieved for a given footprint area, the assembly 100 can suffer from a number of disadvantages. In particular, the relatively large solder balls, such as the solder balls 124a and 124b, spanning a distance between the top package 102 and the bottom package 104 take up valuable area on the upper surface 120 of the substrate unit 112, thereby hindering the ability to reduce a distance between adjacent ones of the solder balls as well as hindering the ability to increase a total number of the solder balls. Also, manufacturing of the assembly 100 can suffer from undesirably low stacking yields, as the solder balls 124a and 124b may not sufficiently adhere to the substrate unit 112 of the bottom package 104 during reflow. This inadequate adherence can be exacerbated by molding operations used to form the package body 116, as a molding material can be prone to overflowing onto and contaminating the peripheral portion of the upper surface 120. Moreover, because of the reduced lateral extent of the package body 116, the assembly 100 can be prone to bending or warping, which can create sufficient stresses on the solder balls 124a and 124b that lead to connection failure.

It is against this background that a need arose to develop the stackable semiconductor device packages and related stacked package assemblies and methods described herein.

SUMMARY

One aspect of the invention relates to semiconductor device packages. In one embodiment, a semiconductor device package includes: (1) a substrate unit including an upper surface, a lower surface, and a lateral surface disposed adjacent to a periphery of the substrate unit and extending between the upper surface and the lower surface of the substrate unit; (2) connecting elements disposed adjacent to the periphery of the substrate unit and extending upwardly from the upper surface of the substrate unit, at least one of the connecting elements having a width $W_C$; (3) a semiconductor device disposed adjacent to the upper surface of the substrate unit and electrically connected to the substrate unit; and (4) a package body disposed adjacent to the upper surface of the substrate unit and covering the semiconductor device, the package body including an upper surface and a lateral surface, the lateral surface of the package body being substantially aligned with the lateral surface of the substrate unit, the package body defining openings disposed adjacent to the upper surface of the package body, the openings at least partially exposing respective ones of the connecting elements, at least one of the openings having a width $W_U$ adjacent to the upper surface of the package body, such that $W_U > W_C$.

Another aspect of the invention relates to stacked package assemblies. In one embodiment, a stacked package assembly includes: (1) a first semiconductor device package including (a) a substrate unit including an upper surface, (b) a semiconductor device disposed adjacent to the upper surface of the substrate unit and electrically connected to the substrate unit, and (c) a package body disposed adjacent to the upper surface of the substrate unit and covering the semiconductor device, the package body including an upper surface and defining openings disposed adjacent to the upper surface of the package body; (2) a second semiconductor device package disposed adjacent to the upper surface of the package body, the second semiconductor device package including a lower surface; and (3) stacking elements extending through respective ones of the openings of the package body and electrically connecting the first semiconductor device package and the second semiconductor device package, at least one of the stacking elements corresponding to a pair of fused conductive bumps and including (a) an upper portion disposed adjacent to the lower surface of the second semiconductor device package and having a width $W_{SU}$, (b) a lower portion having a lateral boundary that is at least partially covered by the package body and having a width $W_{SL}$, and (c) a middle portion disposed between the upper portion and the lower portion and having a width $W_{SM}$, such that $W_S \geq 0.8 \times \min(W_{SU}, W_{SL})$.

A further aspect of the invention relates to manufacturing methods. In one embodiment, a manufacturing method includes: (1) providing a substrate including an upper surface and contact pads disposed adjacent to the upper surface of the substrate; (2) applying an electrically conductive material to the upper surface of the substrate to form conductive bumps disposed adjacent to respective ones of the contact pads; (3) electrically connecting a semiconductor device to the upper surface of the substrate; (4) applying a molding material to the upper surface of the substrate to form a molded structure covering the conductive bumps and the semiconductor device, the molded structure including an upper surface; (5) forming openings adjacent to the upper surface of the molded structure, the openings partially exposing respective ones of the conductive bumps to define covered portions and uncovered portions of the conductive bumps, at least one of the openings having a central depth $D_C$ and a peripheral depth $D_P$, the central depth $D_C$ corresponding to a distance between the upper surface of the molded structure and an upper end of a respective one of the conductive bumps, the peripheral depth $D_P$ corresponding to a distance between the upper surface of the molded structure and a boundary between a covered portion and an uncovered portion of the respective one of the conductive bumps, the peripheral depth $D_P$ being greater than the central depth $D_C$, such that $D_P = cD_C$, and $c \geq 1.5$; and (6) forming cutting slits extending through the molded structure and the substrate.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

FIG. 6A through FIG. 6C illustrate enlarged, cross-sectional views of a portion of the assembly of FIG. 5.

FIG. 9A through FIG. 9G illustrate a manufacturing method of forming the package of FIG. 2 and the assembly of FIG. 5, according to an embodiment of the invention.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a semiconductor device can include multiple semiconductor devices unless the context clearly dictates otherwise.

As used herein, the term "set" refers to a collection of one or more components. Thus, for example, a set of layers can include a single layer or multiple layers. Components of a set also can be referred as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top, " "bottom," "upper," "upwardly, " "lower, " "downwardly, " "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," "connecting," and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1:
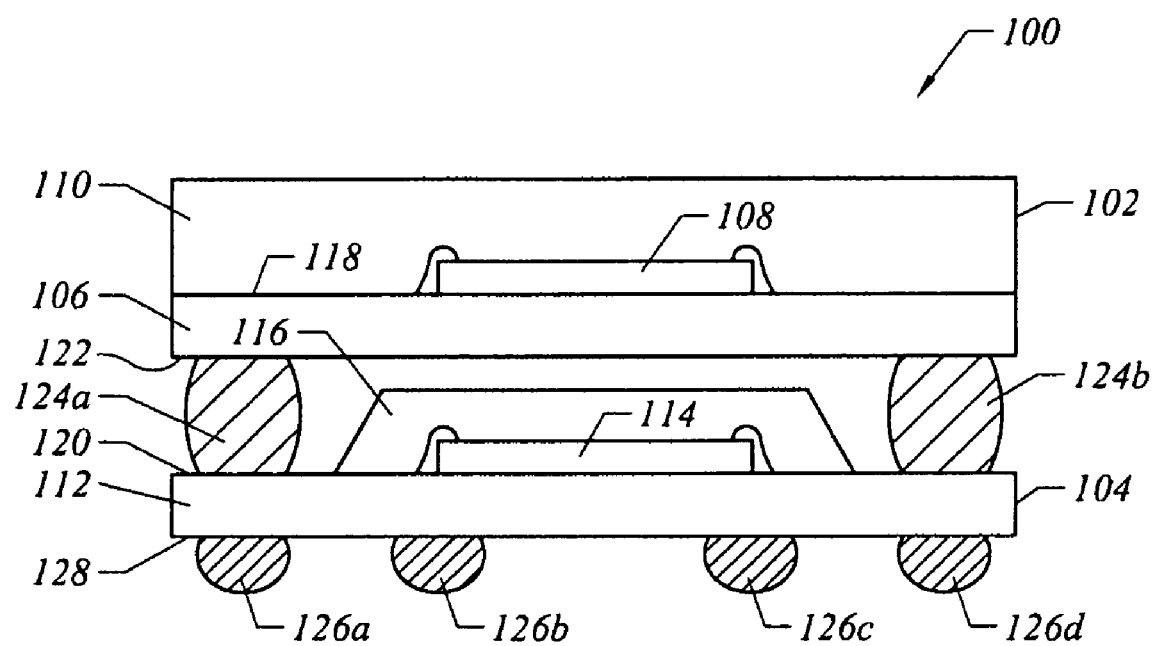
FIG. 1 illustrates a stacked package assembly implemented in accordance with a conventional approach.
Figure 2:
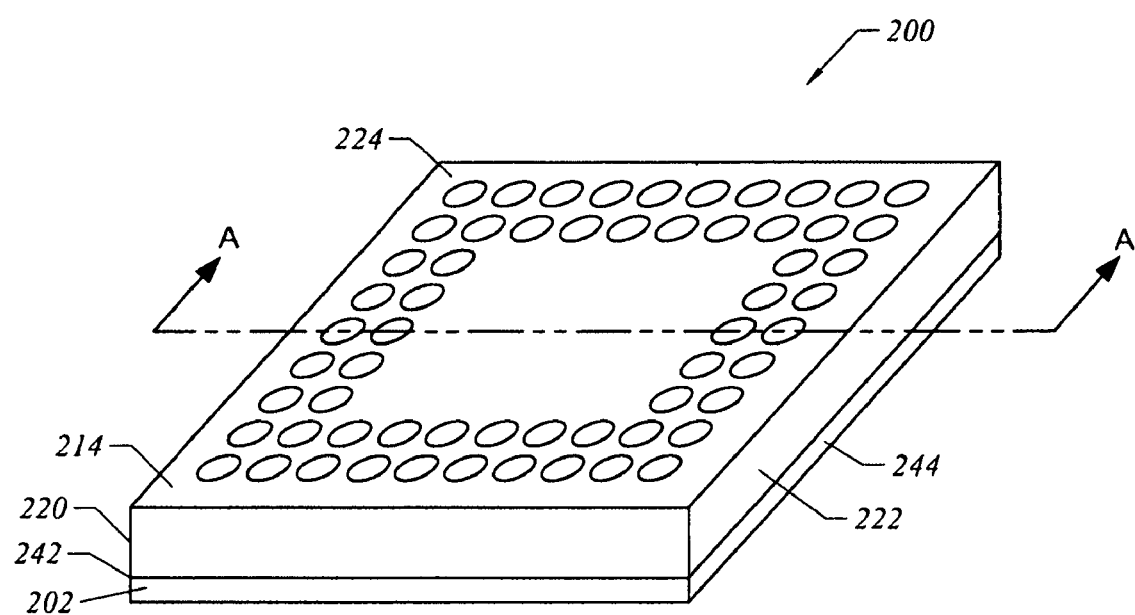
FIG. 2 illustrates a perspective view of a stackable semiconductor device package implemented in accordance with an embodiment of the invention.
Figure 3:
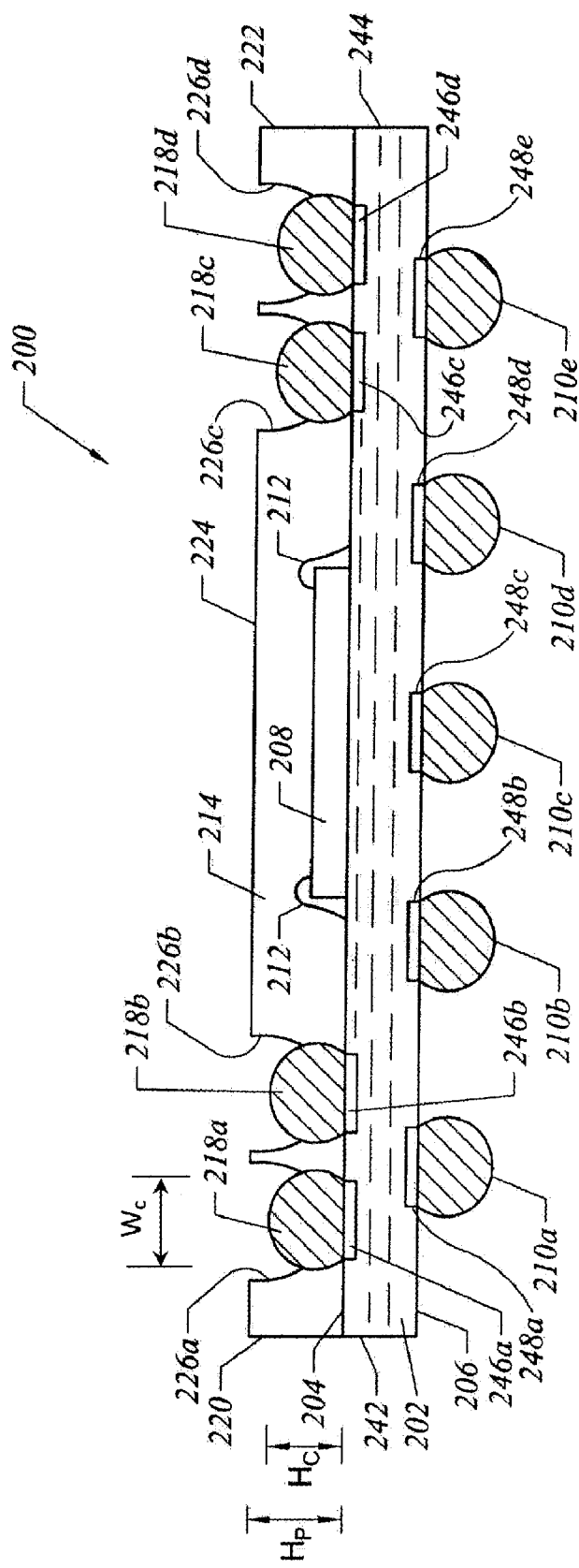
FIG. 3 illustrates a cross-sectional view of the package of FIG. 2, taken along line A-A of FIG. 2.

Attention first turns to FIG. 2 and FIG. 3, which illustrate a stackable semiconductor device package 200 implemented in accordance with an embodiment of the invention. In particular, FIG. 2 illustrates a perspective view of the package 200, while FIG. 3 illustrates a cross-sectional view of the package 200, taken along line A-A of FIG. 2. In the illustrated embodiment, sides of the package 200 are substantially planar and have a substantially orthogonal orientation so as to define a lateral profile that extends around substantially an entire periphery of the package 200. However, it is contemplated that the lateral profile of the package 200, in general, can be any of a number of shapes, such as curved, inclined, stepped, or roughly textured.

Referring to FIG. 2 and FIG. 3, the package 200 includes a substrate unit 202, which includes an upper surface 204, a lower surface 206, and lateral surfaces, including lateral surfaces 242 and 244, which are disposed adjacent to sides of the substrate unit 202 and extend between the upper surface 204 and the lower surface 206. In the illustrated embodiment, the lateral surfaces 242 and 244 are substantially planar and have a substantially orthogonal orientation with respect to the upper surface 204 or the lower surface 206, although it is contemplated that the shapes and orientations of the lateral surfaces 242 and 244 can vary for other implementations. For certain implementations, a thickness of the substrate unit 202, namely a vertical distance between the upper surface 204 and the lower surface 206 of the substrate unit 202, can be in the range of about 0.1 millimeter ("mm") to about 2 mm, such as from about 0.2 mm to about 1.5 mm or from about 0.4 mm to about 0.6 mm.

The substrate unit 202 can be implemented in a number of ways, and includes electrical interconnect to provide electrical pathways between the upper surface 204 and the lower surface 206 of the substrate unit 202. As illustrated in FIG. 3, the substrate unit 202 includes contact pads 246a, 246b, 246c, and 246d, which are disposed adjacent to a peripheral portion of the upper surface 204, and contact pads 248a, 248b, 248c, 248d, and 248e, which are disposed adjacent to the lower surface 206. In the illustrated embodiment, the contact pads 246a, 246b, 246c, and 246d and the contact pads 248a, 248b, 248c, 248d, and 248e are implemented as conductive ball pads to allow mounting of conductive balls, although it is contemplated that their implementation can vary from that illustrated in FIG. 3. The contact pads 246a, 246b, 246c, and 246d are distributed in the form of rows extending within and along the sides of the substrate unit 202, while the contact pads 248a, 248b, 248c, 248d, and 248e are distributed in the form of an array. However, it is contemplated that the distribution of the contact pads 246a, 246b, 246c, and 246d and the contact pads 248a, 248b, 248c, 248d, and 248e can vary for other implementations. The contact pads 246a, 246b, 246c, and 246d and the contact pads 248a, 248b, 248c, 248d, and 248e are connected to other electrical interconnect included in the substrate unit 202, such as a set of electrically conductive layers that are incorporated within a set of dielectric layers. The electrically conductive layers can be connected to one another by internal vias, and can be implemented so as to sandwich a core formed from a suitable resin, such as one based on bismaleimide and triazine or based on epoxy and polyphenylene oxide. For example, the substrate unit 202 can include a substantially slab-shaped core that is sandwiched by one set of electrically conductive layers disposed adjacent to an upper surface of the core and another set of electrically conductive layers disposed adjacent to a lower surface of the core. While not illustrated in FIG. 3, it is contemplated that a solder mask layer can be disposed adjacent to either, or both, the upper surface 204 and the lower surface 206 of the substrate unit 202.

As illustrated in FIG. 3, the package 200 also includes connecting elements 218a, 218b, 218c, and 218d that are disposed adjacent to the peripheral portion of the upper surface 204. The connecting elements 218a, 218b, 218c, and 218d are electrically connected to and extend upwardly from respective ones of the contact pads 246a, 246b, 246c, and 246d and, accordingly, are distributed in the form of rows extending within and along the sides of the substrate unit 202. As further described below, the connecting elements 218a, 218b, 218c, and 218d provide electrical pathways between the package 200 and another package within a stacked package assembly. In the illustrated embodiment, the connecting elements 218a, 218b, 218c, and 218d are implemented as conductive balls and, more particularly, as conductive balls that are reflowed to form conductive bumps in accordance with manufacturing operations further described below. The connecting elements 218a, 218b, 218c, and 218d are formed from a metal, a metal alloy, a matrix with a metal or a metal alloy dispersed therein, or another suitable electrically conductive material. As illustrated in FIG. 3, a size of each connecting element 218a, 218b, 218c, or 218d can be specified in accordance with a height $H_C$ of the connecting element 218a, 218b, 218c, or 218d, namely a maximum vertical extent of the connecting element 218a, 218b, 218c, or 218d, and a width $W_C$ of the connecting element 218a, 218b, 218c, or 218d, namely a maximum lateral extent of the connecting element 218a, 218b, 218c, or 218d. For certain implementations, the height $H_C$ of each connecting element 218a, 218b, 218c, or 218d can be in the range of about 50 micrometer ("μm") to about 450 μm, such as from about 100 μm to about 400 μm or from about 150 μm to about 350 μm, and the width $W_C$ of each connecting element 218a, 218b, 218c, or 218d can be in the range of about 100 μm to about 500 μm, such as from about 150 μm to about 450 μm or from about 200 μm to about 400 μm.

Referring to FIG. 3, the package 200 also includes a semiconductor device 208, which is disposed adjacent to the upper surface 204 of the substrate unit 202, and connecting elements 210a, 210b, 210c, 210d, and 210e, which are disposed adjacent to the lower surface 206 of the substrate unit 202. In the illustrated embodiment, the semiconductor device 208 is a semiconductor chip, such as a processor or a memory device. The semiconductor device 208 is wire-bonded to the substrate unit 202 via a set of wires 212, which are formed from gold, copper, or another suitable electrically conductive material. For certain implementations, at least a subset of the wires 212 is desirably formed from copper, since, as compared to gold, copper has a superior electrical conductivity and a lower cost, while allowing the wires 212 to be formed with reduced diameters. The wires 212 can be coated with a suitable metal, such as palladium, as a protection against oxidation and other environmental conditions. The connecting elements 210a, 210b, 210c, 210d, and 210e provide input and output electrical connections for the package 200, and are electrically connected to and extend downwardly from respective ones of the contact pads 248a, 248b, 248c, 248d, and 248e. In the illustrated embodiment, the connecting elements 210a, 210b, 210c, 210d, and 210e are implemented as conductive balls and, more particularly, as conductive balls that are reflowed to form conductive bumps in accordance with manufacturing operations further described below. The connecting elements 210a, 210b, 210c, 210d, and 210e are formed from a metal, a metal alloy, a matrix with a metal or a metal alloy dispersed therein, or another suitable electrically conductive material. At least a subset of the connecting elements 210a, 210b, 210c, 210d, and 210e is electrically connected to the semiconductor device 208 via electrical interconnect included in the substrate unit 202, and at least the same or a different subset of the connecting elements 210a, 210b, 210c, 210d, and 210e is electrically connected to the connecting elements 218a, 218b, 218c, and 218d via electrical interconnect included in the substrate unit 202. While the single semiconductor device 208 is illustrated in FIG. 3, it is contemplated that additional semiconductor devices can be included for other implementations, and that semiconductor devices, in general, can be any active devices, any passive devices, or combinations thereof.

Referring to FIG. 2 and FIG. 3, the package 200 also includes a package body 214 that is disposed adjacent to the upper surface 204 of the substrate unit 202. In conjunction with the substrate unit 202, the package body 214 substantially covers or encapsulates the semiconductor device 208 and the wires 212 to provide structural rigidity as well as protection against oxidation, humidity, and other environmental conditions. Advantageously, the package body 214 extends to the sides of the substrate unit 202 and partially covers or encapsulates the connecting elements 218a, 218b, 218c, and 218d along the peripheral portion of the upper surface 204 so as to provide improved structural rigidity and reduced tendency towards bending or warping.

The package body 214 is formed from a molding material, and includes an upper surface 224 and lateral surfaces, including lateral surfaces 220 and 222, which are disposed adjacent to sides of the package body 214. In the illustrated embodiment, the upper surface 224 is substantially planar and has a substantially parallel orientation with respect to the upper surface 204 or the lower surface 206 of the substrate unit 202. Accordingly, a thickness $H_P$ of the package body 214, namely a vertical distance between the upper surface 224 of the package body 214 and the upper surface 204 of the substrate unit 202, is substantially uniform across the upper surface 204 of the substrate unit 202, thereby allowing the package body 214 to provide a more uniform coverage of the upper surface 204 and improved structural rigidity. However, it is contemplated that the upper surface 224 can be curved, inclined, stepped, or roughly textured for other implementations. For certain implementations, the thickness $H_P$ of the package body 214 can be in the range of about 100 µm to about 600 µm, such as from about 150 µm to about 550 µm or from about 200 µm to about 500 µm. Disposed adjacent to a peripheral portion of the upper surface 224 and extending downwardly from the upper surface 224 are depressions, including depressions 226a, 226b, 226c, and 226d, which define apertures or openings corresponding to respective ones of the connecting elements 218a, 218b, 218c, and 218d. The openings at least partially expose the connecting elements 218a, 218b, 218c, and 218d for stacking another package on top of the package 200. Like the connecting elements 218a, 218b, 218c, and 218d, the openings are distributed in the form of rows, with each row extending along four sides of a substantially rectangular pattern or a substantially square-shaped pattern. While two rows of openings are illustrated in FIG. 2 and FIG. 3, it is contemplated that more or less rows of openings can be included for other implementations, and that openings, in general, can be distributed in any one-dimensional pattern or any two-dimensional pattern.

Referring to FIG. 2 and FIG. 3, the lateral surfaces 220 and 222 of the package body 214 are substantially planar and have a substantially orthogonal orientation with respect to the upper surface 204 or the lower surface 206 of the substrate unit 202, although it is contemplated that the lateral surfaces 220 and 222 can be curved, inclined, stepped, or roughly textured for other implementations. Also, the lateral surfaces 220 and 222 are substantially aligned or co-planar with the lateral surfaces 242 and 244 of the substrate unit 202, respectively, such that, in conjunction with the lateral surfaces 242 and 244, the lateral surfaces 220 and 222 define the orthogonal lateral profile of the package 200. More particularly, this alignment is accomplished such that a lateral extent of the package body 214 substantially corresponds to that of the substrate unit 202, thereby allowing the package body 214 to provide a more uniform coverage of the upper surface 204 and improved structural rigidity. For other implementations, it is contemplated that the shapes of the lateral surfaces 220 and 222 and their alignment with the lateral surfaces 242 and 244 can be varied from that illustrated in FIG. 2 and FIG. 3, while providing sufficient structural rigidity and allowing the connecting elements 218a, 218b, 218c, and 218d to be at least partially exposed.

Figure 4:
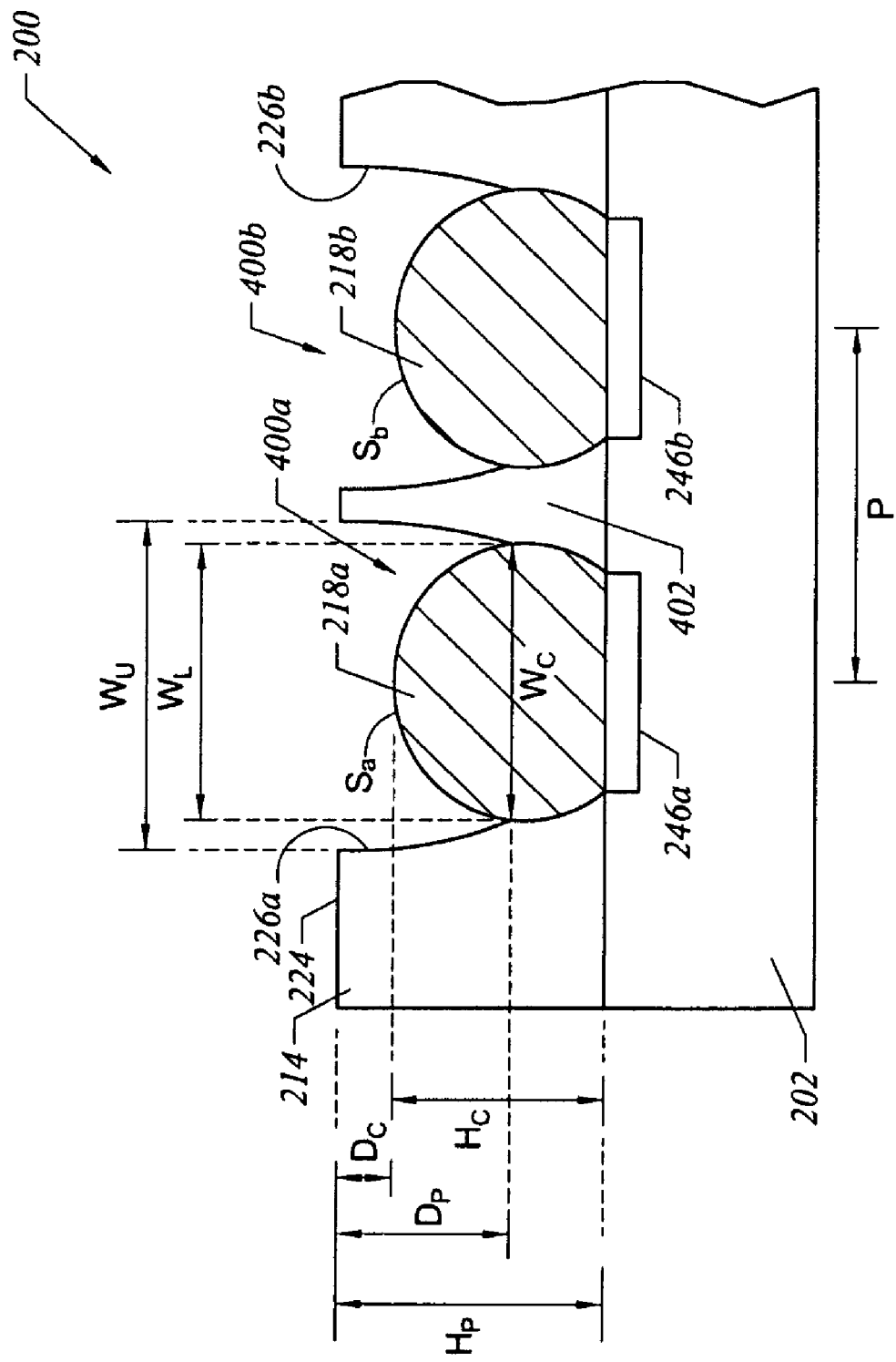
FIG. 4 illustrates an enlarged, cross-sectional view of a portion of the package of FIG. 2.

Attention next turns to FIG. 4, which illustrates an enlarged, cross-sectional view of a portion of the package 200 of FIG. 2 and FIG. 3. In particular, FIG. 4 illustrates a particular implementation of the package body 214 and the connecting elements 218a and 218b, while certain other details of the package 200 are omitted for ease of presentation.

As illustrated in FIG. 4, the package body 214 is formed with the depressions 226a and 226b, which define openings 400a and 400b that are sized to expose connection surfaces $S_a$ and $S_b$ of the connecting elements 218a and 218b. In the illustrated embodiment, a size of each opening 400a or 400b can be specified in accordance with a width and a depth of the opening 400a or 400b. A number of advantages can be achieved by suitable selection and control over shapes and sizes of the openings 400a and 400b, shapes and sizes of the connecting elements 218a and 218b, or a combination of these characteristics. In particular, by exposing the connection surfaces $S_a$ and $S_b$, the connecting elements 218a and 218b, in effect, can serve as a pre-solder for improved adherence and wetting with respect to connecting elements of another package when stacking that package on top of the package 200. Also, the relatively large areas of the connection surfaces $S_a$ and $S_b$ can enhance reliability and efficiency of electrical connections, thereby improving stacking yields. During stacking operations, the package body 214 can have a tendency to expand towards and apply stresses onto the connecting elements 218a and 218b, and, if not sufficiently relieved, these expansion stresses can push portions of the connecting elements 218a and 218b, in a molten form, in a generally vertical direction and away from the contact pads 246a and 246b. Suitably sizing the openings 400a and 400b to expose the connection surfaces $S_a$ and $S_b$ can yield a reduction in contact areas between the connecting elements 218a and 218b and the package body 214, thereby relieving expansion stresses that can otherwise lead to connection failure. Moreover, the openings 400a and 400b can accommodate connecting elements of another package and can avoid or reduce instances of overflow of a conductive material during stacking operations, thereby allowing stacking elements to be formed with a reduced distance with respect to one another.

In the illustrated embodiment, an opening, such as the opening 400a or 400b, is shaped in the form of a circular cone or a circular funnel, including a substantially circular cross-section with a width that varies along a vertical direction. In particular, a lateral boundary of an opening, such as defined by the depression 226a or 226b, tapers towards a respective connecting element, such as the connecting element 218a or 218b, and contacts the connecting element to define a boundary between an uncovered, upper portion of the connecting element and a covered, lower portion of the connecting element. However, it is contemplated that the shape of an opening, in general, can be any of a number of shapes. For example, an opening can have another type of tapered shape, such as an elliptical cone shape, a square cone shape, or a rectangular cone shape, a non-tapered shape, such as a circular cylindrical shape, an elliptic cylindrical shape, a square cylindrical shape, or a rectangular cylindrical shape, or another regular or irregular shape. It is also contemplated that a lateral boundary of an opening, such as defined by the depression 226a or 226b, can be curved in a convex fashion, curved in a concave fashion, or roughly textured.

For certain implementations, an upper width $W_U$ of each opening 400a or 400b, namely a lateral extent adjacent to an upper end of the opening 400a or 400b and adjacent to the upper surface 224 of the package body 214, can be in the range of about 250 µm to about 650 µm, such as from about 300 µm to about 600 µm or from about 350 µm to about 550 µm, and a lower width $W_L$ of each opening 400a or 400b, namely a lateral extent adjacent to a lower end of the opening 400a or 400b and adjacent to the boundary between covered and uncovered portions of a respective connecting element 218a or 218b, can be in the range of about 90 µm to about 500 µm, such as from about 135 µm to about 450 µm or from about 180 µm to about 400 µm. If the opening 400a or 400b has a non-uniform cross-sectional shape, the upper width $W_U$ or the lower width $W_L$ can correspond to, for example, an average of lateral extents along orthogonal directions. Also, the upper width $W_U$ of each opening 400a or 400b can be greater than the lower width $W_L$ of the opening 400a or 400b, with a ratio of the upper width $W_U$ and the lower width $W_L$ corresponding to an extent of tapering and represented as follows: $W_U = aW_L$, where a is in the range of about 1.1 to about 1.7, such as from about 1.2 to about 1.6 or from about 1.3 to about 1.5. Alternatively, or in conjunction, the upper width $W_U$ and the lower width $W_L$ can be represented relative to the width $W_C$ of a respective connecting element 218a or 218b as follows: $W_U > W_C$ and $W_C \geq W_L \geq bW_C$, where b sets a lower bound for the lower width $W_L$, and can be, for example, about 0.8, about 0.85, or about 0.9. For certain implementations, an upper bound for the upper width $W_U$ can be represented as follows: $P \geq W_U > W_C$, where P corresponds to a distance between centers of nearest-neighbor connecting elements, such as the connecting elements 218a and 218b, which distance is also sometimes referred as a connecting element pitch. For certain implementations, the connecting element pitch P can be in the range of about 300 µm to about 800 µm, such as from about 350 µm to about 650 µm or from about 400 µm to about 600 µm. By setting the upper bound for the upper width $W_U$ in such fashion, the openings 400a and 400b can be sufficiently sized, while retaining a lateral wall 402 that is disposed between the connecting elements 218a and 218b, as well as lateral walls between other connecting elements. The lateral wall 402 can serve as a barrier to avoid or reduce instances of overflow of an electrically conductive material during stacking operations, thereby allowing stacking elements to be formed with a reduced distance with respect to one another.

Still referring to FIG. 4, a connecting element, such as the connecting element 218a or 218b, is sized relative to the thickness $H_P$ of the package body 214, such that an upper end of the connecting element is recessed below the upper surface 224 of the package body 214, namely such that the height $H_C$ of the connecting element is less than the thickness $H_P$ of the package body 214. However, it is also contemplated that an upper end of a connecting element can be substantially aligned or co-planar with the upper surface 224 or can protrude above the upper surface 224. As illustrated in FIG. 4, an opening, such as the opening 400a or 400b, has a depth that varies along a lateral direction or along a radial direction relative to a center of the opening. In the illustrated embodiment, a central depth $D_C$ of each opening 400a or 400b, namely a vertical distance between the upper surface 224 of the package body 214 and an upper end of a respective connecting element 218a or 218b, corresponds to a minimum depth of the opening 400a or 400b, while a peripheral depth $D_P$ adjacent to a lower end of each opening 400a or 400b, namely a vertical distance between the upper surface 224 of the package body 214 and a boundary between covered and uncovered portions of a respective connecting element 218a or 218b, corresponds to a maximum depth of the opening 400a or 400b. For certain implementations, the central depth $D_C$ of each opening 400a or 400b can be in the range of about 20 µm to about 400 µm, such as from about 20 µm to about 180 µm, from about 50 µm to about 150 µm, or from about 80 µm to about 120 µm, and the peripheral depth $D_P$ of each opening 400a or 400b can be in the range of about 100 µm to about 500 µm, such as from about 150 µm to about 450 µm or from about 200 µm to about 400 µm. More particularly, the peripheral depth $D_P$ of each opening 400a or 400b can be greater than the central depth $D_C$ of the opening 400a or 400b, with a ratio of the peripheral depth $D_P$ and the central depth $D_C$ represented as follows: $D_P = cD_C$, where $c \geq 1.5$ and can be in the range of about 1.5 to about 4.5, such as from about 2 to about 4 or from about 2.5 to about 3.5. Alternatively, or in conjunction, the peripheral depth $D_P$ can be represented relative to the thickness $H_P$ of the package body 214 and the width $W_C$ of a respective connecting element 218a or 218b as follows: $H_P \geq D_P \geq dW_C$, where d sets a lower bound for the peripheral depth $D_P$, and can be, for example, about 0.4, about 0.45, or about 0.5.

Figure 5:
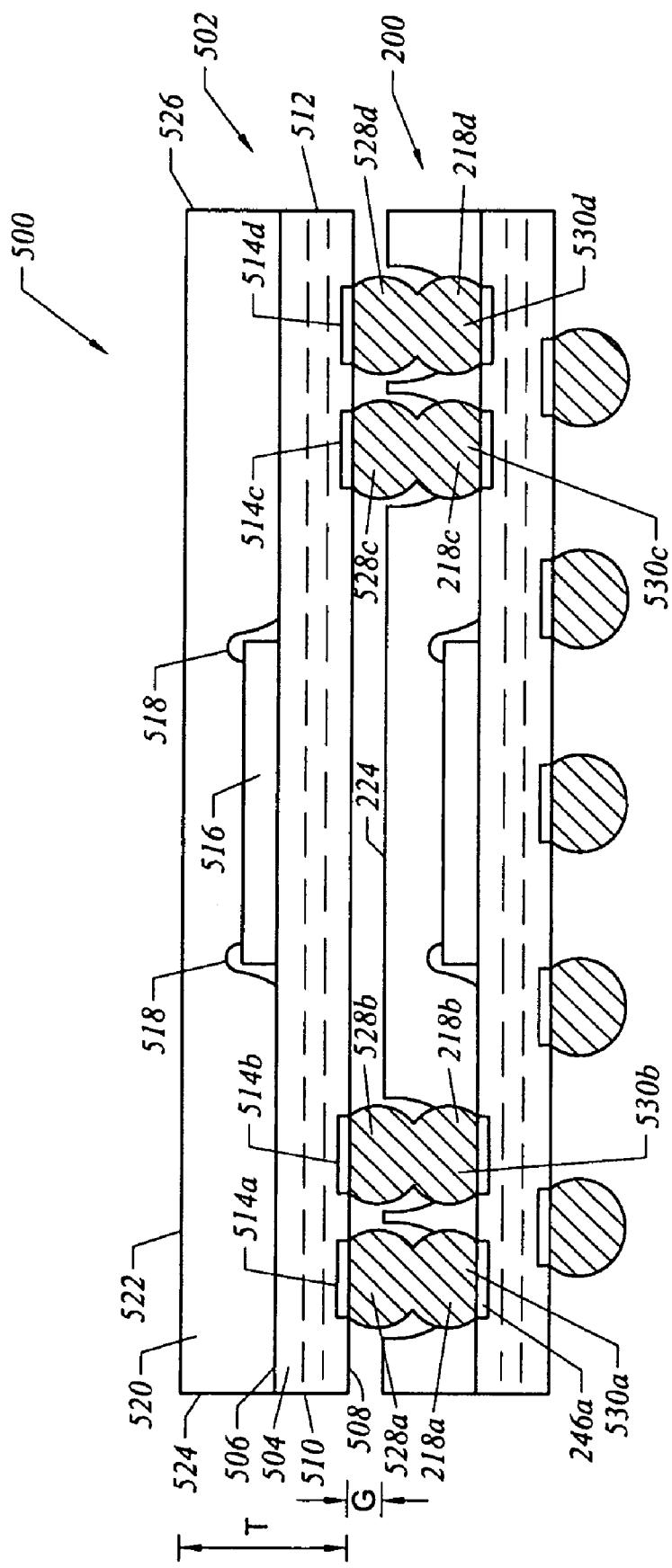
FIG. 5 illustrates a cross-sectional view of a stacked package assembly formed using the package of FIG. 2, according to an embodiment of the invention.

FIG. 5 illustrates a cross-sectional view of a stacked package assembly 500 implemented in accordance with an embodiment of the invention. In particular, FIG. 5 illustrates a particular implementation of the assembly 500 that is formed using the package 200 of FIG. 2 through FIG. 4.

As illustrated in FIG. 5, the assembly 500 includes a semiconductor device package 502, which corresponds to a top package that is disposed above and electrically connected to the package 200 that corresponds to a bottom package. In the illustrated embodiment, the package 502 is implemented as a ball grid array ("BGA") package, although it is contemplated that a number of other package types can be used, including a land grid array ("LGA") package, a quad flat no-lead ("QFN") package, an advanced QFN ("aQFN") package, and other types of BGA package, such as a window BGA package. While the two stacked packages 200 and 502 are illustrated in FIG. 5, it is contemplated that additional packages can be included for other implementations. Certain aspects of the package 502 can be implemented in a similar fashion as previously described for the package 200 and, thus, are not further described herein.

Referring to FIG. 5, the package 502 includes a substrate unit 504, which includes an upper surface 506, a lower surface 508, and lateral surfaces, including lateral surfaces 510 and 512, which are disposed adjacent to sides of the substrate unit 504 and extend between the upper surface 506 and the lower surface 508. The substrate unit 504 also includes contact pads 514a, 514b, 514c, and 514d, which are disposed adjacent to the lower surface 508. In the illustrated embodiment, the contact pads 514a, 514b, 514c, and 514d are implemented as conductive ball pads that are distributed in the form of rows, although it is contemplated that their implementation and distribution can vary from that illustrated in FIG. 5.

The package 502 also includes a semiconductor device 516, which is a semiconductor chip that is disposed adjacent to the upper surface 506 of the substrate unit 504. In the illustrated embodiment, the semiconductor device 516 is wire-bonded to the substrate unit 504 via a set of wires 518, although it is contemplated that the semiconductor device 516 can be electrically connected to the substrate unit 504 in another fashion, such as by flip chip-bonding. While the single semiconductor device 516 is illustrated within the package 502, it is contemplated that additional semiconductor devices can be included for other implementations.

Disposed adjacent to the upper surface 506 of the substrate unit 504 is a package body 520, which substantially covers or encapsulates the semiconductor device 516 and the wires 518 to provide structural rigidity as well as protection against environmental conditions. The package body 520 includes an upper surface 522 and lateral surfaces, including lateral surfaces 524 and 526, which are disposed adjacent to sides of the package body 520. In the illustrated embodiment, the lateral surfaces 524 and 526 are substantially aligned or co-planar with the lateral surfaces 510 and 512 of the substrate unit 504, respectively, such that, in conjunction with the lateral surfaces 510 and 512, the lateral surfaces 524 and 526 define an orthogonal lateral profile of the package 502. Referring to FIG. 5, a lateral extent of the package 502 substantially corresponds to that of the package 200, although it is contemplated that the package 502 can be implemented with a greater or a smaller lateral extent relative to the package 200. Also, a thickness T of the package 502, namely a vertical distance between the upper surface 522 of the package body 520 and the lower surface 508 of the substrate unit 504, substantially corresponds to that of the package 200, although it is contemplated that the package 502 can be implemented with a greater or a smaller thickness relative to the package 200.

Referring to FIG. 5, the package 502 also includes connecting elements 528a, 528b, 528c, and 528d, which are disposed adjacent to the lower surface 508 of the substrate unit 504. The connecting elements 528a, 528b, 528c, and 528d provide input and output electrical connections for the package 502, and are electrically connected to and extend downwardly from respective ones of the contact pads 514a, 514b, 514c, and 514d. In the illustrated embodiment, the connecting elements 528a, 528b, 528c, and 528d are implemented as conductive balls and, more particularly, as conductive balls that are reflowed to form conductive bumps. Like the connecting elements 218a, 218b, 218c, and 218d, the connecting elements 528a, 528b, 528c, and 528d are distributed in the form of rows, with each row extending along four sides of a substantially rectangular pattern or a substantially square-shaped pattern.

During stacking operations, the connecting elements 528a, 528b, 528c, and 528d of the package 502 are reflowed and undergo metallurgical bonding with the connecting elements 218a, 218b, 218c, and 218d of the package 200. In particular, the connecting elements 528a, 528b, 528c, and 528d fuse or merge with respective ones of the connecting elements 218a, 218b, 218c, and 218d to form stacking elements 530a, 530b, 530c, and 530d, which provide electrical pathways between the packages 200 and 502. As illustrated in FIG. 5, each stacking element, such as the stacking element 530a, extends and spans a distance between the packages 200 and 502, such as corresponding to a vertical distance between the contact pad 246a of the package 200 and the contact pad 514a of the package 502. In conjunction, the stacking elements 530a, 530b, 530c, and 530d retain the packages 200 and 502 so as to be spaced apart from one another by a substantially uniform gap G, which corresponds to a vertical distance between the lower surface 508 of the package 502 and the upper surface 224 of the package 200. For certain implementations, the gap G can be in the range of about 10 µm to about 100 µm, such as from about 20 µm to about 80 µm or from about 30 µm to about 70 µm. Suitable selection and control over sizes of the connecting elements 528a, 528b, 528c, and 528d and sizes of the connecting elements 218a, 218b, 218c, and 218d allow the gap G to be varied, and, in some implementations, the gap G can be reduced such that the lower surface 508 of the package 502 is in contact with the upper surface 224 of the package 200.

A number of advantages can be achieved by stacking the packages 200 and 502 in the fashion illustrated in FIG. 5. In particular, because a pair of connecting elements, such as the connecting elements 218a and 528b, are included to span the distance between the packages 200 and 502, each of the pair of connecting elements can have a reduced size, relative to a conventional implementation using a single, relatively large solder ball to span that distance. And, a resulting stacking element, such as the stacking element 530a, can have a reduced lateral extent and can take up less valuable area, thereby allowing the ability to reduce a distance between adjacent stacking elements as well as the ability to increase a total number of stacking elements. In the illustrated embodiment, the distance between adjacent stacking elements can be specified in accordance with a stacking element pitch P', which corresponds to a distance between centers of nearest-neighbor stacking elements, such as the stacking elements 530a and 530b. For certain implementations, the stacking element pitch P' can substantially correspond to the connecting element pitch P, which was previously described with reference to FIG. 4. By suitable selection and control over sizes of the connecting elements 528a, 528b, 528c, and 528d and sizes of the connecting elements 218a, 218b, 218c, and 218d, the stacking element pitch P' can be reduced relative to a conventional implementation, and, in some implementations, the stacking element pitch P' (and the connecting element pitch P) can be in the range of about 300 µm to about 800 µm, such as from about 300 µm to about 500 µm or from about 300 µm to about 400 µm.

Certain aspects of stacking elements can be further appreciated with reference to FIG. 6A through FIG. 6C, which illustrate enlarged, cross-sectional views of a portion of the assembly 500 of FIG. 5. In particular, FIG. 6A through FIG. 6C illustrate particular implementations of the opening 400a and the stacking element 530a, while certain other details of the assembly 500 are omitted for ease of presentation.

As illustrated in FIG. 6A through FIG. 6C, the stacking element 530a is implemented as an elongated structure and, more particularly, as a conductive post that is formed as a result of fusing or merging of the connecting elements 218a and 528a. The stacking element 530a is shaped in the form of a dumbbell, and includes an upper portion 600 and a lower portion 604, which are relatively larger than a middle portion 602 that is disposed between the upper portion 600 and the lower portion 604. However, it is contemplated that the shape of the stacking element 530a, in general, can be any of a number of shapes. The upper portion 600 substantially corresponds to, or is formed from, the connecting element 528a, the lower portion 604 substantially corresponds to, or is formed from, the connecting element 218a, and the middle portion 602 substantially corresponds to, or is formed from, an interface between the connecting elements 218a and 528a. As illustrated in FIG. 6A through FIG. 6C, a lateral boundary of the lower portion 604 is substantially covered or encapsulated by the package body 214, and a lateral boundary of the upper portion 600 is at least partially disposed within the opening 400a and is spaced apart from the package body 214 so as to remain exposed. However, it is contemplated that the extent of coverage of the upper portion 600 and the lower portion 604 can be varied for other implementations.

Referring to FIG. 6A through FIG. 6C, a size of the stacking element 530a can be specified in accordance with its height $H_S$, namely a vertical extent of the stacking element 530a, a width $W_{SU}$ of the upper portion 600, namely a maximum lateral extent of the upper portion 600, a width $W_{SL}$ of the lower portion 604, namely a maximum lateral extent of the lower portion 604, and a width $W_{SM}$ of the middle portion 602, namely a minimum lateral extent of the middle portion 602. As can be appreciated, the height $H_S$ of the stacking element 530a can substantially correspond to a sum of the thickness $H_P$ of the package body 214 and the gap G between the packages 200 and 502, which were previously described with reference to FIG. 3 through FIG. 5, and, as illustrated in FIG. 6A through FIG. 6C, the stacking element 530a protrudes above the upper surface 224 of the package body 214 to an extent corresponding to the gap G. Also, the width $W_{SL}$ of the lower portion 604 can substantially correspond to the width $W_C$ of the connecting element 218a, which was previously described with reference to FIG. 3 and FIG. 4. In addition, the width $W_{SM}$ of the middle portion 602 can correspond to a minimum lateral extent of the stacking element 530a, and a ratio of the width $W_{SM}$ relative to the width $W_{SU}$ or the width $W_{SL}$ can correspond to an extent of inward tapering of the middle portion 602, relative to the upper portion 600 or the lower portion 604. For certain implementations, the width $W_{SM}$ can be represented relative to the smaller of the width $W_{SU}$ and the width $W_{SL}$ as follows: $W_{SM} \geq e \times \min(W_{SU}, W_{SL})$, where e sets a lower bound on the extent of inward tapering and is less than or equal to 1.

The shape and size of the stacking element 530a can be controlled by suitable selection and control over the shape and size of the opening 400a, the shapes and sizes of the connecting elements 218a and 528a, or a combination of these characteristics. In particular, it can be desirable to adjust the relative sizes of the upper portion 600 and the lower portion 604 in terms of a ratio of their widths $W_{SU}$ and $W_{SL}$, such as by selection and control over the relative sizes of the connecting elements 218a and 528a. Also, it can be desirable to adjust the extent of inward tapering of the middle portion 602, such as by selection and control over the size of the opening 400a. In particular, because excessive inward tapering can lead to cracking, reducing the extent of inward tapering can improve structural rigidity of the stacking element 530a, thereby enhancing reliability and efficiency of electrical connections between the packages 200 and 502.

In accordance with a first implementation of FIG. 6A, the width $W_{SU}$ is greater than the width $W_{SL}$, such as by sizing the connecting element 528a to be greater than the connecting element 218a. More particularly, a ratio of the width $W_{SU}$ and the width $W_{SL}$ can be represented as follows: $W_{SU} = fW_{SL}$, where f is in the range of about 1.05 to about 1.7, such as from about 1.1 to about 1.6 or from about 1.2 to about 1.5. In addition, suitably sizing the opening 400a allows accommodation of the greater sized connecting element 528a and control over the extent of inward tapering. In particular, the width $W_{SM}$ can be represented as follows: $W_{SM} \geq e \times \min(W_{SU}, W_{SL}) = eW_{SL}$, where e can be, for example, about 0.8, about 0.85, or about 0.9. It is also contemplated that the width $W_{SL}$ can be greater than the width $W_{SU}$, such as by sizing the connecting element 218a to be greater than the connecting element 528a, and that a ratio of the width $W_{SL}$ and the width $W_{SU}$ can be represented as follows: $W_{SL} = gW_{SU}$, where g is in the range of about 1.05 to about 1.7, such as from about 1.1 to about 1.6 or from about 1.2 to about 1.5. In the case that the width $W_{SL}$ is greater than the width $W_{SU}$, the width $W_{SM}$ can be as follows: $W_{SM} \geq e \times \min(W_{SU}, W_{SL}) = eW_{SU}$, where e can be, for example, about 0.8, about 0.85, or about 0.9.

In accordance with a second implementation of FIG. 6B, the width $W_{SU}$ is substantially the same as the width $W_{SL}$, such as by similarly sizing the connecting elements 218a and 528a. In addition, suitably sizing the opening 400a allows control over the extent of inward tapering. In particular, the width $W_{SM}$ can be represented as follows: $W_{SM} \geq e \times \min(W_{SU}, W_{SL}) = eW_{SU} = eW_{SL}$. Like the first implementation, e according to the second implementation can be, for example, about 0.8, about 0.85, or about 0.9.

Like the second implementation, the width $W_{SU}$ in accordance with a third implementation of FIG. 6C is substantially the same as the width $W_{SL}$, such as by similarly sizing the connecting elements 218a and 528a. However, by contrast, the extent of inward tapering is more pronounced in the third implementation, and, thus, the first and second implementations can be more desirable from the standpoint of improved structural rigidity and enhanced reliability and efficiency of electrical connections.

Figure 7:
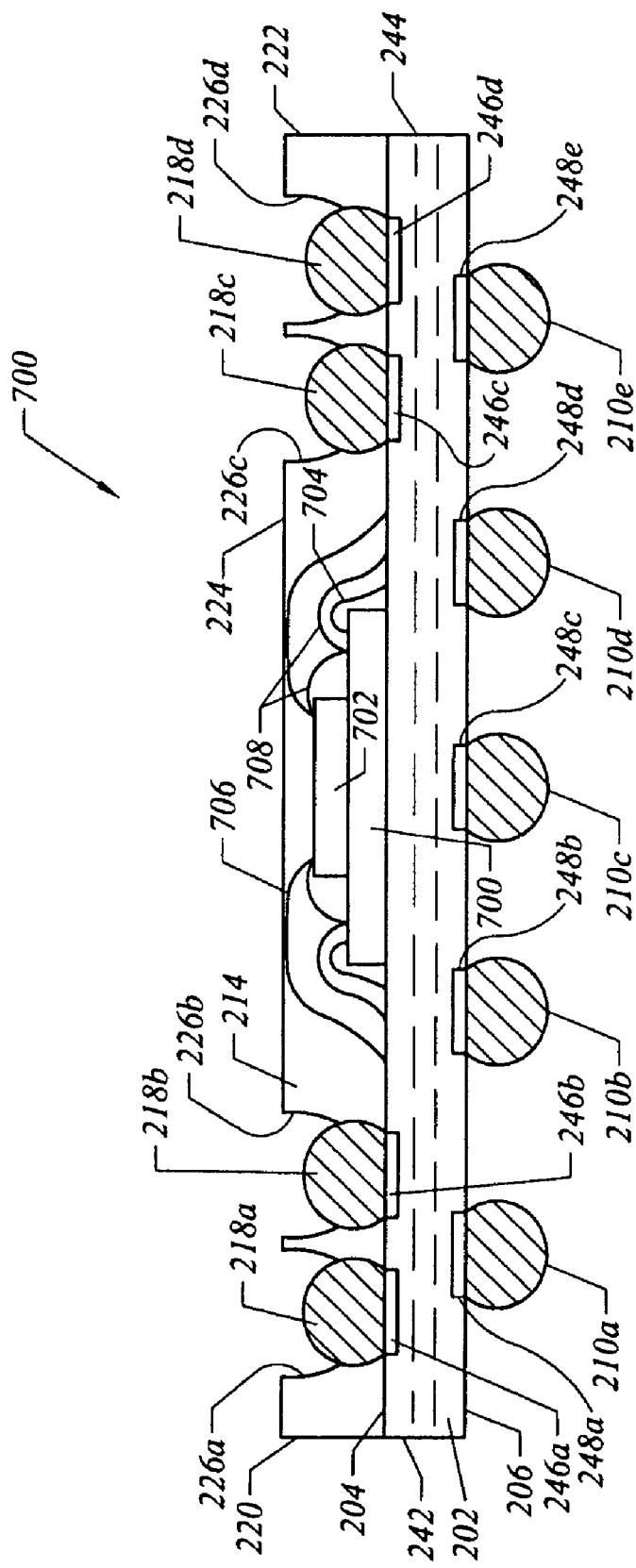
FIG. 7 illustrates a cross-sectional view of a stackable semiconductor device package implemented in accordance with another embodiment of the invention.

FIG. 7 illustrates a cross-sectional view of a stackable semiconductor device package 700 implemented in accordance with another embodiment of the invention. Certain aspects of the package 700 can be implemented in a similar fashion as previously described for the package 200 of FIG. 2 through FIG. 4 and, thus, are not further described herein.

Referring to FIG. 7, the package 700 includes multiple semiconductor devices, namely a semiconductor device 700, which is disposed adjacent to the upper surface 204 of the substrate unit 202, and a semiconductor device 702, which is disposed adjacent to the semiconductor device 700. In the illustrated embodiment, the semiconductor devices 700 and 702 are semiconductor chips, and are secured to one another in a suitable fashion, such as using a die attach film or an adhesive. Advantageously, such stacking of the semiconductor devices 700 and 702 within the package 700 achieves a higher density of semiconductor devices for a given footprint area, beyond that achieved by stacking multiple semiconductor device packages each including a single semiconductor device. While the two semiconductor devices 700 and 702 are illustrated in FIG. 7, it is contemplated that additional semiconductor devices can be included within the package 700 to achieve an even higher density of semiconductor devices.

As illustrated in FIG. 7, the semiconductor device 700 is wire-bonded to the substrate unit 202 via a set of wires 704, and the semiconductor device 702 is wire-bonded to the substrate unit 202 via a set of wires 706 and a set of wires 708, the latter of which electrically connect the semiconductor device 702 to the substrate unit 202 via the semiconductor device 700. The wires 704, 706, and 708 are formed from gold, copper, or another suitable electrically conductive material. For certain implementations, at least a subset of the wires 704, 706, and 708 is desirably formed from copper, and can be coated with a suitable metal, such as palladium, as a protection against oxidation and other environmental conditions.

Figure 8:
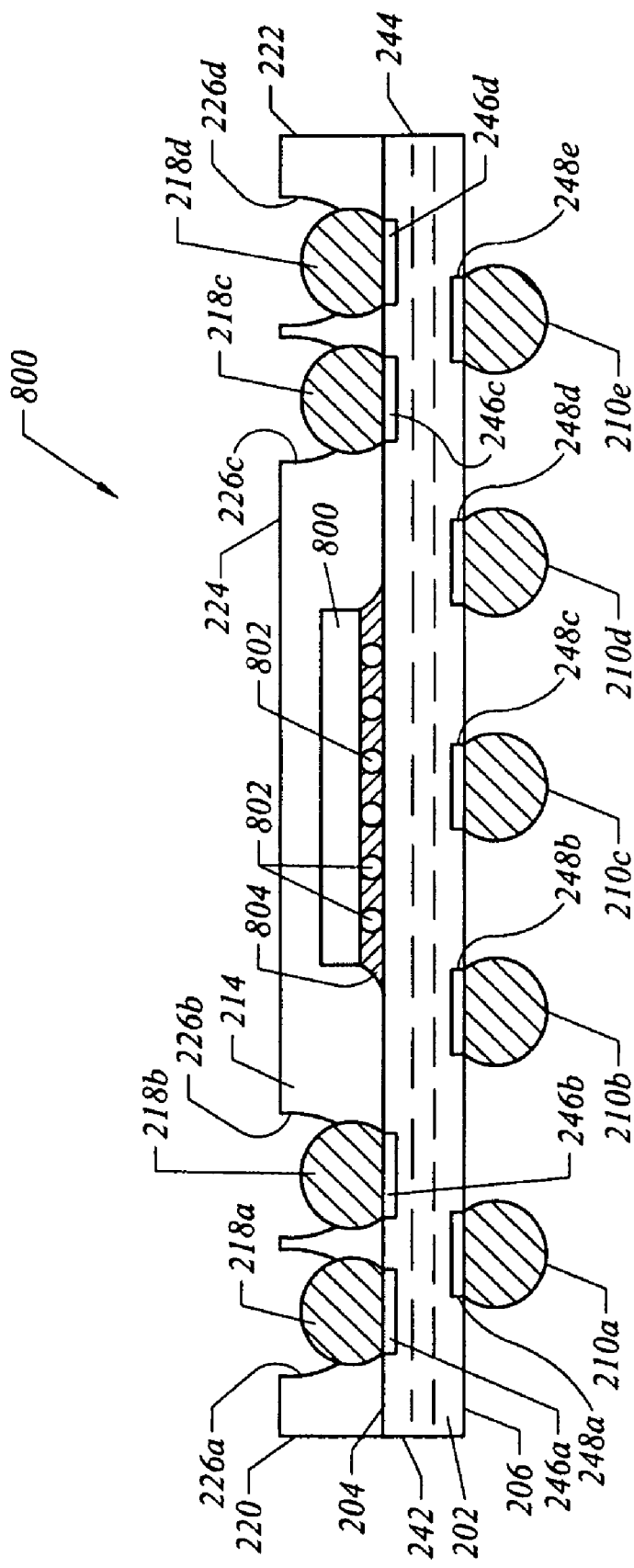
FIG. 8 illustrates a cross-sectional view of a stackable semiconductor device package implemented in accordance with another embodiment of the invention.

FIG. 8 illustrates a cross-sectional view of a stackable semiconductor device package 800 implemented in accordance with another embodiment of the invention. Certain aspects of the package 800 can be implemented in a similar fashion as previously described for the package 200 of FIG. 2 through FIG. 4 and, thus, are not further described herein.

Referring to FIG. 8, the package 800 includes a semiconductor device 800, which is a semiconductor chip that is disposed adjacent to the upper surface 204 of the substrate unit 202. In the illustrated embodiment, the semiconductor device 800 is flip chip-bonded to the substrate unit 202 via a set of conductive bumps 802, which are formed from solder, copper, nickel, or another suitable electrically conductive material. For certain implementations, at least a subset of the conductive bumps 802 is desirably formed as a multi-layer bumping structure, including a copper post disposed adjacent to the semiconductor device 800, a solder layer disposed adjacent to the substrate unit 202, and a nickel barrier layer disposed between the copper post and the solder layer to suppress diffusion and loss of copper. Certain aspects of such a multi-layer bumping structure is described in the co-pending and co-owned Patent Application Publication No. 2006/0094224, the disclosure of which is incorporated herein by reference in its entirety. As illustrated in FIG. 8, the semiconductor device 800 is secured to the substrate unit 202 using an underfill material 804, which is formed from an adhesive or another suitable material, although it is contemplated that the underfill material 804 can be omitted for other implementations. It is also contemplated that the semiconductor device 800 can be electrically connected to the substrate unit 202 in another fashion, such as by wire-bonding. Moreover, while the single semiconductor device 800 is illustrated in FIG. 8, it is contemplated that additional semiconductor devices can be included within the package 800 to achieve a higher density of semiconductor devices for a given footprint area.

FIG. 9A through FIG. 9G illustrate a manufacturing method of forming a stackable semiconductor device package and a stacked package assembly, according to an embodiment of the invention. For ease of presentation, the following manufacturing operations are described with reference to the package 200 of FIG. 2 through FIG. 4 and with reference to the assembly 500 of FIG. 5 through FIG. 6C. However, it is contemplated that the manufacturing operations can be similarly carried out to form other stackable semiconductor device packages and other stacked package assemblies, such as the package 700 of FIG. 7 and the package 800 of FIG. 8.

Referring first to FIG. 9A, a substrate 900 is provided. To enhance manufacturing throughput, the substrate 900 includes multiple substrate units, including the substrate unit 202 and an adjacent substrate unit 202', thereby allowing certain of the manufacturing operations to be readily performed in parallel or sequentially. The substrate 900 can be implemented in a strip fashion, in which the multiple substrate units are arranged sequentially in an one-dimensional pattern, or in an array fashion, in which the multiple substrate units are arranged in a two-dimensional pattern. For ease of presentation, the following manufacturing operations are primarily described with reference to the substrate unit 202 and related components, although the manufacturing operations can be similarly carried for other substrate units and related components.

As illustrated in FIG. 9A, multiple contact pads are disposed adjacent to an upper surface 902 of the substrate 900, and multiple contact pads are disposed adjacent to a lower surface 904 of the substrate 900. In particular, the contact pads 246a, 246b, 246c, and 246d are disposed adjacent to the upper surface 902, while the contact pads 248a, 248b, 248c, 248d, and 248e are disposed adjacent to the lower surface 904. In the illustrated embodiment, conductive bumps are subsequently disposed adjacent to respective ones of the contact pads 246a, 246b, 246c, and 246d and the contact pads 248a, 248b, 248c, 248d, and 248e, which serve to electrically connect the conductive bumps to electrical interconnect included in the substrate 900. The contact pads 246a, 246b, 246c, and 246d and the contact pads 248a, 248b, 248c, 248d, and 248e can be formed in any of a number of ways, such as photolithography, chemical etching, laser ablation or drilling, or mechanical drilling to form openings, along with plating of the openings using a metal, a metal alloy, a matrix with a metal or a metal alloy dispersed therein, or another suitable electrically conductive material. While not illustrated in FIG. 9A, it is contemplated that a tape can be used to secure the lower surface 904 of the substrate 900 during subsequent operations. The tape can be implemented as a single-sided adhesive tape or a double-sided adhesive tape.

Once the substrate 900 is provided, an electrically conductive material 906 is applied to the upper surface 902 of the substrate 900 and disposed adjacent to the contact pads 246a, 246b, 246c, and 246d. The electrically conductive material 906 includes a metal, a metal alloy, a matrix with a metal or a metal alloy dispersed therein, or another suitable electrically conductive material. For example, the electrically conductive material 906 can include a solder, which can be formed from any of a number of fusible metal alloys having melting points in the range of about 90° C. to about 450° C. Examples of such fusible metal alloys include tin-lead alloys, copper-zinc alloys, copper-silver alloys, tin-silver-copper alloys, bismuth-containing alloys, indium-containing alloys, and antimony-containing alloys. As another example, the electrically conductive material 906 can include a solid core formed from a metal, a metal alloy, or a resin, which solid core can be coated with a solder. As a further example, the electrically conductive material 906 can include an electrically conductive adhesive, which can be formed from any of a number of resins having an electrically conductive filler dispersed therein. Examples of suitable resins include epoxy-based resins and silicone-based resins, and examples of suitable fillers include silver fillers and carbon fillers.

In the illustrated embodiment, a dispenser 908 is laterally positioned with respect to the substrate 900 and is used to apply the electrically conductive material 906. In particular, the dispenser 908 is substantially aligned with the contact pads 246a, 246b, 246c, and 246d, thereby allowing the electrically conductive material 906 to be selectively applied to the contact pads 246a, 246b, 246c, and 246d. While the single dispenser 908 is illustrated in FIG. 9A, it is contemplated that multiple dispensers can be used to further enhance manufacturing throughput. Still referring to FIG. 9A, the dispenser 908 applies the electrically conductive material 906 in the form of conductive balls each having a substantially spherical or substantially spheroidal shape, although it is contemplated that the shapes of the conductive balls can vary for other implementations.

Once applied, the electrically conductive material 906 is reflowed, such as by raising the temperature to near or above a melting point of the electrically conductive material 906. As a result of gravity and other effects, the electrically conductive material 906 is drawn downwardly towards the contact pads 246a, 246b, 246c, and 246d, as illustrated in FIG. 9B, thereby enhancing reliability and efficiency of electrical connections with the contact pads 246a, 246b, 246c, and 246d. Once sufficiently reflowed, the electrically conductive material 906 is hardened or solidified, such as by lowering the temperature to below the melting point of the electrically conductive material 906. This solidification operation forms conductive bumps, which correspond to the connecting elements 218a, 218b, 218c, and 218d that are disposed adjacent to respective ones of the contact pads 246a, 246b, 246c, and 246d.

Figure 9C:
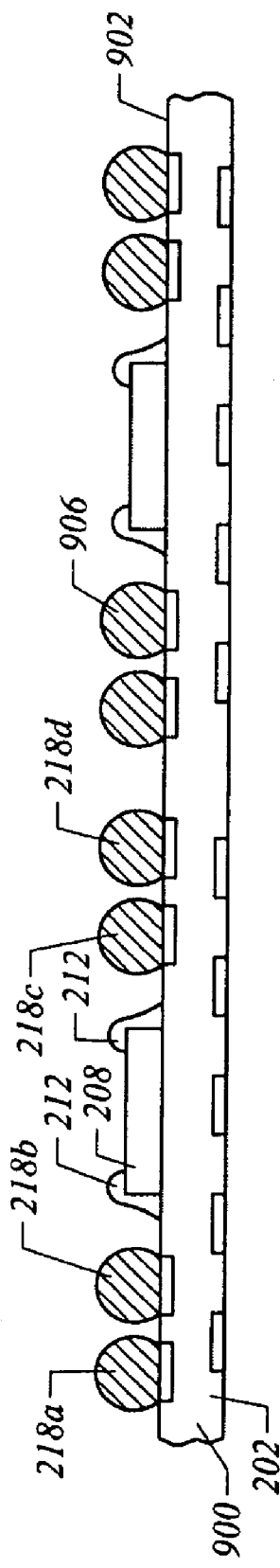

Next, as illustrated in FIG. 9C, the semiconductor device 208 is disposed adjacent to the upper surface 902 of the substrate 900, and is electrically connected to the substrate unit 202. In particular, the semiconductor device 208 is wire-bonded to the substrate unit 202 via the wires 212. It is contemplated that the ordering of operations by which the connecting elements 218a, 218b, 218c, and 218d and the semiconductor device 208 are disposed adjacent to the substrate 900 can be varied for other implementations. For example, the semiconductor device 208 can be disposed adjacent to the substrate 900, and, subsequently, the electrically conductive material 906 can be applied to the substrate 900 to form the connecting elements 218a, 218b, 218c, and 218d.

Figure 9D:
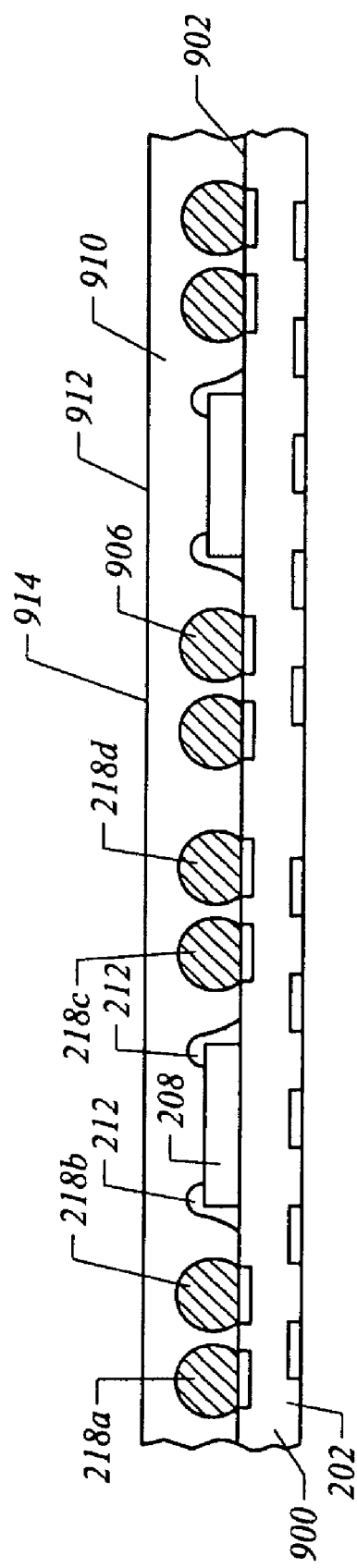

Referring next to FIG. 9D, a molding material 910 is applied to the upper surface 902 of the substrate 900 so as to substantially cover or encapsulate the connecting elements 218a, 218b, 218c, and 218d, the semiconductor device 208, and the wires 212. In particular, the molding material 910 is applied across substantially an entire area of the upper surface 902, thereby providing improved structural rigidity and avoiding or reducing issues related to overflowing and contamination for a conventional implementation. Also, manufacturing cost is reduced by simplifying molding operations as well as reducing the number of those molding operations. The molding material 910 can include, for example, a Novolac-based resin, an epoxy-based resin, a silicone-based resin, or another suitable encapsulant. Suitable fillers also can be included, such as powdered $SiO_2$. The molding material 910 can be applied using any of a number of molding techniques, such as compression molding, injection molding, and transfer molding. Once applied, the molding material 910 is hardened or solidified, such as by lowering the temperature to below a melting point of the molding material 910, thereby forming a molded structure 912. To facilitate proper positioning of the substrate 900 during subsequent operations, fiducial marks can be formed in the molded structure 912, such as using laser marking. Alternatively, or in conjunction, fiducial marks can be formed adjacent to a periphery of the substrate 900.

Laser ablation or drilling is next carried out with respect to an upper surface 914 of the molded structure 912. Referring to FIG. 9E, laser ablation is carried out using a laser 916, which applies a laser beam or another form of optical energy to remove portions of the molded structure 912. In particular, the laser 916 is laterally positioned and substantially aligned with each connecting element 218a, 218b, 218c, or 218d, such that the applied laser beam forms the depressions 226a, 226b, 226c, and 226d that expose respective ones of the connecting elements 218a, 218b, 218c, and 218d. The alignment of the laser 916 during laser ablation can be aided by fiducial marks, which allow proper positioning of the laser 916 when forming the depressions 226a, 226b, 226c, and 226d.

The laser 916 can be implemented in a number of ways, such as a green laser, an infrared laser, a solid-state laser, or a $CO_2$ laser. The laser 916 can be implemented as a pulsed laser or a continuous wave laser. Suitable selection and control over operating parameters of the laser 916 allow control over sizes and shapes of the depressions 226a, 226b, 226c, and 226d as well as sizes and shapes of resulting openings, including the openings 400a and 400b. For certain implementations, a peak output wavelength of the laser 916 can be selected in accordance with a particular composition of the molded structure 912, and, for some implementations, the peak output wavelength can be in the visible range or the infrared range. Also, an operating power of the laser 916 can be in the range of about 3 Watts ("W") to about 20 W, such as from about 3 W to about 15 W or from about 3 W to about 10 W. In the case of a pulsed laser implementation, a pulse frequency and a pulse duration are additional examples of operating parameters that can be suitably selected and controlled. While the single laser 916 is illustrated in FIG. 9E, it is contemplated that multiple lasers can be used to further enhance manufacturing throughput. Also, it is contemplated that another suitable technique can be used in place of, or in conjunction with, laser ablation, such as chemical etching or mechanical drilling.

As a result of laser ablation, exposed connection surfaces of the connecting elements 218a, 218b, 218c, and 218d sometimes can be roughly textured or contaminated with residues. In such instances, the exposed connection surfaces can be subjected to cleaning operations to smooth those surfaces, such as by applying an alkaline solution or another basic solution.

Next, as illustrated in FIG. 9F, singulation is carried out with respect to the upper surface 914 of the molded structure 912. Such manner of singulation can be referred as "front-side" singulation. However, it is contemplated that singulation can be carried out with respect to the lower surface 904 of the substrate 900, and can be referred as "back-side" singulation. Referring to FIG. 9F, the "front-side" singulation is carried out using a saw 920, which forms cutting slits, including a cutting slit 922. In particular, the cutting slits extend downwardly and completely through the substrate 900 and the molded structure 912, thereby sub-dividing the substrate 900 and the molded structure 912 into discrete units, including the substrate unit 202 and the package body 214. In such manner, the package 200 is formed. The alignment of the saw 920 during the "front-side" singulation can be aided by fiducial marks, which allow proper positioning of the saw 920 when forming the cutting slits.

Still referring to FIG. 9F, the connecting elements 210a, 210b, 210c, 210d, and 210e are disposed adjacent to the lower surface 206 of the substrate unit 202. The connecting elements 210a, 210b, 210c, 210d, and 210e can be formed in a similar fashion as described above for the connecting elements 218a, 218b, 218c, and 218d, such as by applying an electrically conductive material and reflowing and solidifying that material to form conductive bumps. The connecting elements 210a, 210b, 210c, 210d, and 210e can be disposed adjacent to the lower surface 206 of the substrate unit 202 prior to or subsequent to the "front-side" singulation.

Figure 9G:
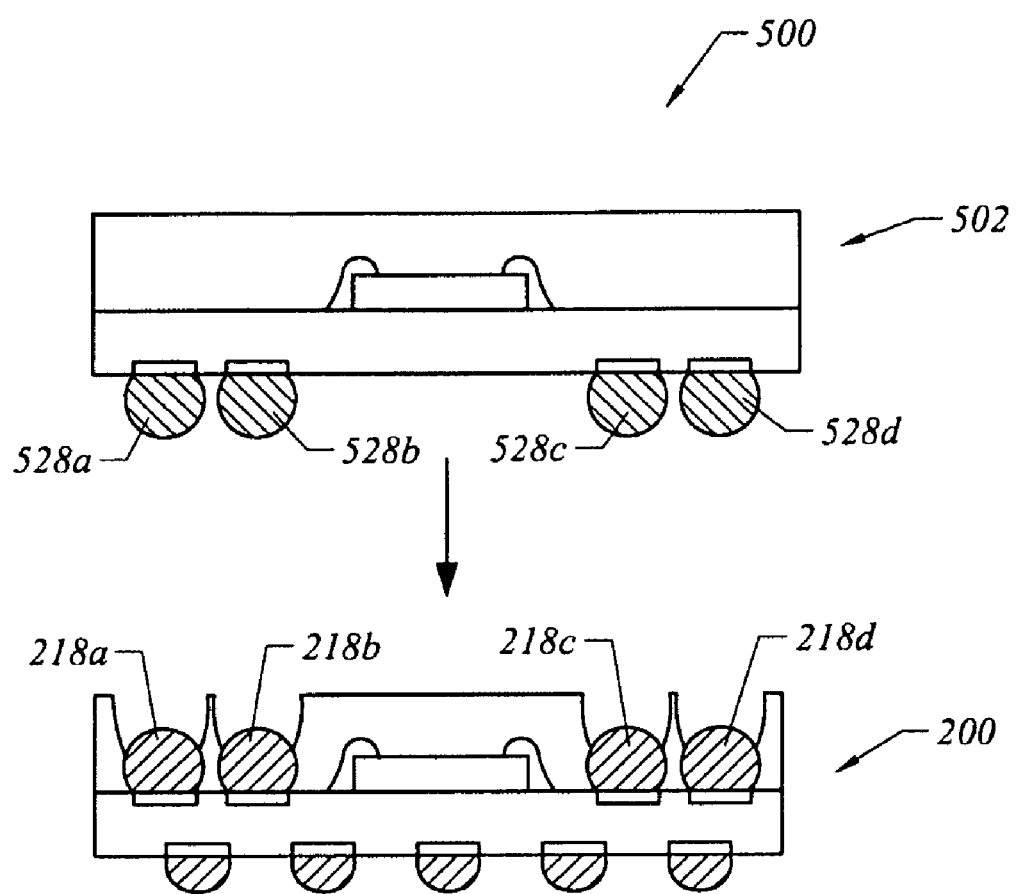

Stacking is next carried out with respect to the package 502 to form the assembly 500, as illustrated in FIG. 5 and FIG. 9G. In particular, the package 502 is positioned with respect to the package 200, such that the connecting elements 528a, 528b, 528c, and 528d of the package 502 are substantially aligned with and adjacent to respective ones of the connecting elements 218a, 218b, 218c, and 218d of the package 200. Once the packages 200 and 502 are positioned in such fashion, the connecting elements 218a, 218b, 218c, and 218d and the connecting elements 528a, 528b, 528c, and 528d are reflowed and solidified, such that metallurgical bonding takes place to form the stacking elements 530a, 530b, 530c, and 530d.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention.

Accordingly, unless specifically indicated herein, the order and grouping of the operations are not limitations of the invention.

What is claimed is:

1. A semiconductor package, comprising:
   a substrate including an upper surface, a lower surface, and a lateral surface disposed adjacent to a periphery of the substrate and extending between the upper surface and the lower surface of the substrate;
   connecting elements disposed adjacent to the periphery of the substrate and extending upwardly from the upper surface of the substrate, at least one of the connecting elements having an upper end; and
   a package body disposed adjacent to the upper surface of the substrate, the package body including an upper surface and a lateral surface, the lateral surface of the package body being substantially aligned with the lateral surface of the substrate, the package body defining openings disposed adjacent to the upper surface of the package body, the openings at least partially exposing respective ones of the connecting elements;
   wherein the openings partially expose respective ones of the connecting elements to define covered portions and uncovered portions of the connecting elements, the at least one of the connecting elements having an uncovered portion that extends to a first location on the at least one of the connecting elements that is closer to the substrate than to the upper end of the at least one of the connecting elements.

2. The semiconductor package of claim 1, wherein:
   at least one of the openings has:
   a peripheral depth extending from the upper surface of the package body to the first location on the at least one of the connecting elements; and
   a central depth extending from the upper surface of the package body to the upper end of the at least one of the connecting elements;
   wherein the peripheral depth is in the range of 1.5 to 4.5 times as large as the central depth.

3. The semiconductor package of claim 1, wherein:
   the at least one of the connecting elements has a width $W_C$;
   at least one of the openings has a width $W_U$ adjacent to the upper surface of the package body, such that $W_U > W_C$, and a distance between nearest-neighbor ones of the connecting elements corresponds to a pitch P, such that $P \geq W_U > W_C$.

4. The semiconductor package of claim 3, wherein at least one of the openings has a width $W_L$ adjacent to the first location on the at least one of the connecting elements, the width $W_U$ is greater than the width $W_L$, such that $W_U = aW_L$, and a is in the range of 1.1 to 1.7.

5. The semiconductor package of claim 4, wherein $W_C \geq W_L \geq 0.8 W_C$.

6. The semiconductor package of claim 1, wherein at least one of the openings has a lateral surface having a first contour extending from the upper surface of the package body to the first location on the at least one of the connecting elements, wherein the first contour is curved.

7. A semiconductor package assembly, comprising:
   a first semiconductor package including:
   a substrate including an upper surface; and
   a package body disposed adjacent to the substrate, the package body including an upper surface and defining openings disposed adjacent to the upper surface of the package body;
   wherein the openings are configured to at least partially expose conductive bumps extending vertically from the substrate such that each of the conductive bumps includes an uncovered portion and a covered portion separated at a boundary adjacent to the each of the conductive bumps; and
   wherein the openings have:
   a peripheral depth extending from the upper surface of the package body to the boundary adjacent to the each of the conductive bumps; and
   a central depth extending from the upper surface of the package body to an upper end of the each of the conductive bumps; and
   wherein the peripheral depth is in the range of 1.5 to 4.5 times as large as the central depth.

8. The semiconductor package assembly of claim 7, further comprising:
   a second semiconductor package disposed adjacent to the upper surface of the package body; and
   stacking elements extending through respective ones of the openings in the package body, and electrically connecting the first semiconductor package and the second semiconductor package.

9. The semiconductor package assembly of claim 8, wherein:
   at least one of the openings has a first width adjacent to the upper surface of the package body; and
   at least one of the stacking elements is narrower than the first width.

10. The semiconductor package assembly of claim 8, wherein the stacking elements protrude from the respective ones of the openings in the package body such that the first semiconductor package is spaced apart from the second semiconductor package by a substantially uniform gap.

11. The semiconductor package assembly of claim 8, wherein a lower portion of each of the stacking elements is disposed adjacent to the upper surface of the substrate, and an upper portion of each of the stacking elements has a lateral boundary that is at least partially disposed within the respective ones of the openings and is spaced apart from the package body.

12. The semiconductor package assembly of claim 7, wherein at least one of the openings has a width $W_L$ adjacent to the boundary between the covered portion and the uncovered portion of a respective one of the conductive bumps, and the first width $W_U$ is greater than the width $W_L$, such that $W_U = aW_L$, and a is in the range of 1.1 to 1.7.

13. The semiconductor package assembly of claim 7, wherein the boundary adjacent to the each of the conductive bumps is closer to the substrate than to the upper end of the each of the conductive bumps.

14. The semiconductor package assembly of claim 7, wherein the peripheral depth is in the range from 2.5 to 3.5 times as large as the central depth.

15. The semiconductor package assembly of claim 7, wherein at least one of the openings has a lateral surface having a first contour extending from the upper surface of the package body to the boundary between the covered portion and the uncovered portion of a respective one of the conductive bumps, wherein the first contour is curved.

16. The semiconductor package assembly of claim 7, further comprising a semiconductor device, wherein the semiconductor device is electrically connected to the substrate via a set of wires formed from at least one of gold and copper.

17. The semiconductor package assembly of claim 16, wherein the set of wires are coated with palladium.

18. The semiconductor package assembly of claim 7, further comprising a semiconductor device, wherein the semiconductor device is electrically connected to the substrate via a set of multi-layer bumping structures.

19. A semiconductor package, comprising:
a substrate having an upper surface;
conductive connectors extending upwardly from the upper surface of the substrate, at least one of the conductive connectors having a first width; and
a package body disposed adjacent to the substrate and having an upper surface, the package body defining cavities each having a lateral surface circumscribing a corresponding one of the conductive connectors, each of the cavities at least partially exposing the corresponding one of the conductive connectors;
wherein at least one of the cavities has a second width adjacent to the upper surface of the package body, the second width being at least as large as the first width; and
wherein the cavities partially expose the conductive connectors to define covered portions and uncovered portions of the conductive connectors, at least one of the cavities defines a boundary between a covered portion and an uncovered portion of a respective one of the conductive connectors, the respective one of the conductive connectors has an upper end, and the boundary is closer to the substrate than to the upper end of the respective one of the conductive connectors.

20. The semiconductor package of claim 19, wherein the second width is in the range of 1.3 to 1.5 times as large as a third width of the at least one of the cavities, the third width being adjacent to the boundary.

21. The semiconductor package of claim 19, wherein the second width is in the range of 1.1 to 1.7 times as large as a third width of the at least one of the cavities, the third width being adjacent to the boundary.

22. The semiconductor package of claim 19, wherein:
the at least one of the cavities has:
a peripheral depth extending from the upper surface of the package body to the boundary; and
a central depth extending from the upper surface of the package body to an upper end of the respective one of the conductive connectors;
wherein the peripheral depth is in the range of 1.5 to 4.5 times as large as the central depth.

23. The semiconductor package of claim 22, wherein the third width is at least as large as 0.8 times the first width, and no greater than the first width.

24. The semiconductor package of claim 19, wherein another semiconductor package is fused to at least one of the conductive connectors to electrically connect to the semiconductor package.

25. The semiconductor package of claim 24, wherein the semiconductor package is spaced apart from the another semiconductor package by a substantially uniform gap.

* * * * *